United States Patent
Howells et al.

(12) 
(10) Patent No.: US 6,183,186 B1
(45) Date of Patent: Feb. 6, 2001

(54) WAFER HANDLING SYSTEM AND METHOD

(75) Inventors: John Howells, West Linn; Andrew P. Gorman, Portland; Randall W. Peltola, Hillsboro, all of OR (US)

(73) Assignee: Daitron, Inc., Wilsonville, OR (US)

( * ) Notice: Under 35 U.S.C. 154(b), the term of this patent shall be extended for 0 days.

(21) Appl. No.: 08/920,431

(22) Filed: Aug. 29, 1997

(51) Int. Cl.$^7$ .................................................. B65G 49/07

(52) U.S. Cl. ...................... 414/416; 414/937; 414/940; 414/749.1; 414/222.01

(58) Field of Search .................................. 414/937, 940, 414/935, 416, 222.01, 217, 609, 592, 939, 676, 749.1; 118/719; 204/298.25

(56) References Cited

U.S. PATENT DOCUMENTS

| | | |
|---|---|---|
| 3,314,554 | 4/1967 | Cuniberti . |
| 4,015,880 | 4/1977 | Colvin et al. . |
| 4,056,198 | 11/1977 | Boserup . |
| 4,449,885 | 5/1984 | Hertel et al. . |
| 4,529,353 | 7/1985 | Dean et al. . |
| 4,587,743 | 5/1986 | Edwards et al. . |
| 4,744,715 | 5/1988 | Kawabata et al. . |
| 4,770,590 | 9/1988 | Hugues et al. . |
| 4,773,687 | 9/1988 | Bush et al. . |
| 4,775,281 | 10/1988 | Prentakis . |
| 4,778,331 * | 10/1988 | Kimata et al. .................. 414/937 X |
| 4,778,332 | 10/1988 | Byers et al. . |
| 4,816,116 | 3/1989 | Davis et al. . |
| 4,826,360 * | 5/1989 | Iwasawa et al. ................ 414/940 X |
| 4,900,212 | 2/1990 | Mikahara . |
| 4,990,047 * | 2/1991 | Wagner et al. .................. 414/937 X |
| 5,004,399 | 4/1991 | Sullivan et al. . |
| 5,011,366 | 4/1991 | Miller . |
| 5,064,337 * | 11/1991 | Asakawa et al. ................ 414/940 X |
| 5,188,501 | 2/1993 | Tomita et al. . |
| 5,193,969 | 3/1993 | Rush et al. . |
| 5,193,972 | 3/1993 | Engelbrecht . |
| 5,207,548 | 5/1993 | Suffel et al. . |
| 5,224,809 | 7/1993 | Maydan et al. . |
| 5,261,776 | 11/1993 | Burck et al. . |
| 5,275,521 | 1/1994 | Wada et al. . |
| 5,277,579 * | 1/1994 | Takanabe ........................ 414/937 X |
| 5,299,901 | 4/1994 | Takayama et al. . |

(List continued on next page.)

FOREIGN PATENT DOCUMENTS

| | | |
|---|---|---|
| 0493117 | 7/1992 | (EP) . |
| 5-47728 | 2/1993 | (JP) . |
| 6-127621 | 5/1994 | (JP) . |

OTHER PUBLICATIONS

Allowed claims from Application Ser. No. 08/920,432, filed Aug. 29, 1997.

Primary Examiner—Frank E. Werner
(74) Attorney, Agent, or Firm—Klarquist Sparkman Campbell Leigh & Whinston LLP

(57) ABSTRACT

Wafers from cassettes placed in a cassette holder at a loading station are transferred by a loader to a conveyor and through a wafer processing stage. From the conveyer, the wafers are delivered to an unloader at an unloading station. The unloader transfers the wafers to cassettes held in a cassette holder at the unloading station. The cassettes may be loaded into the rear of the loading station and removed from the rear of the unloading station. The cassette holders support plural stacks of at least two cassettes which are independently indexed upwardly and downwardly. The stacks of cassettes are also carried by a cassette positioner which is transversely shiftable to position a first stack in a wafer transfer zone while a second stack is in a cassette transfer zone spaced from the wafer transfer zone and vice versa. The loader may include an arm which is linearly translated and is rotated about its longitudinal axis to invert the wafer for delivery to a destination location. The unloader may be a water slide having a plurality of grooves for carrying water which spreads out from the grooves in the presence of a wafer to support the wafer as it slides down the water slide.

14 Claims, 14 Drawing Sheets

U.S. PATENT DOCUMENTS

| | | |
|---|---|---|
| 5,382,128 | 1/1995 | Takahashi et al. . |
| 5,507,614 | 4/1996 | Leonov et al. . |
| 5,525,024 | 6/1996 | Freerks et al. . |
| 5,603,777 * | 2/1997 | Ohasi ............................ 414/940 X |
| 5,738,482 | 4/1998 | Piazza . |
| 5,772,386 | 6/1998 | Mages et al. . |
| 5,829,939 * | 11/1998 | Iwai et al. ...................... 414/940 X |
| 5,863,170 * | 1/1999 | Boitnott et al. ................. 414/937 X |
| 5,915,910 | 6/1999 | Howells et al. . |

* cited by examiner

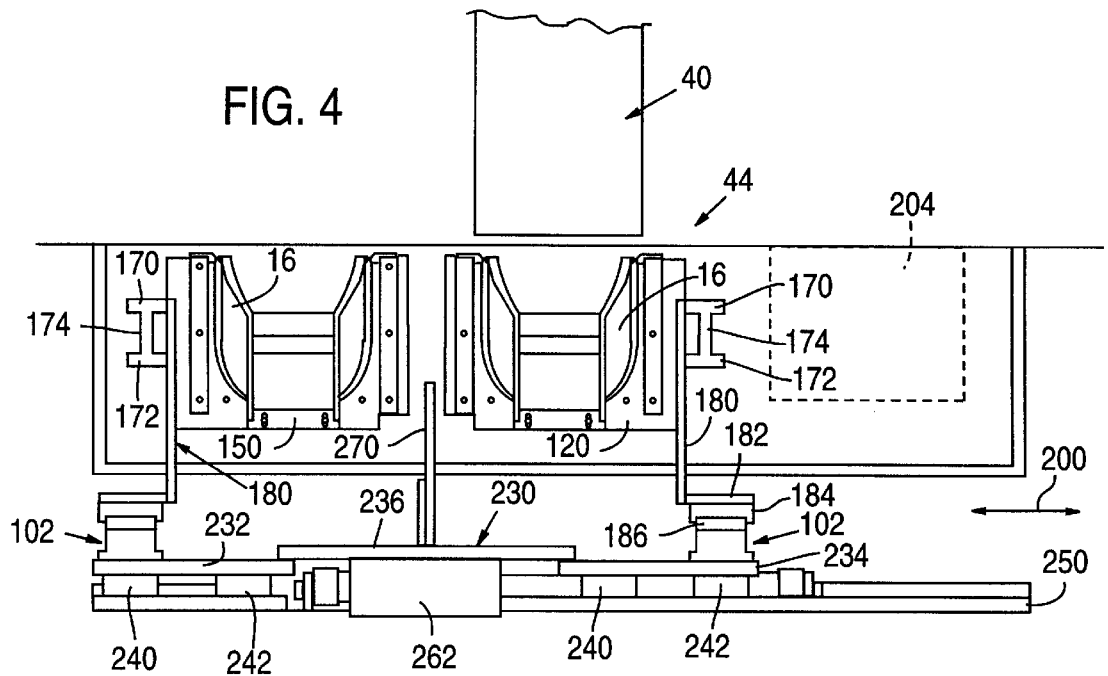
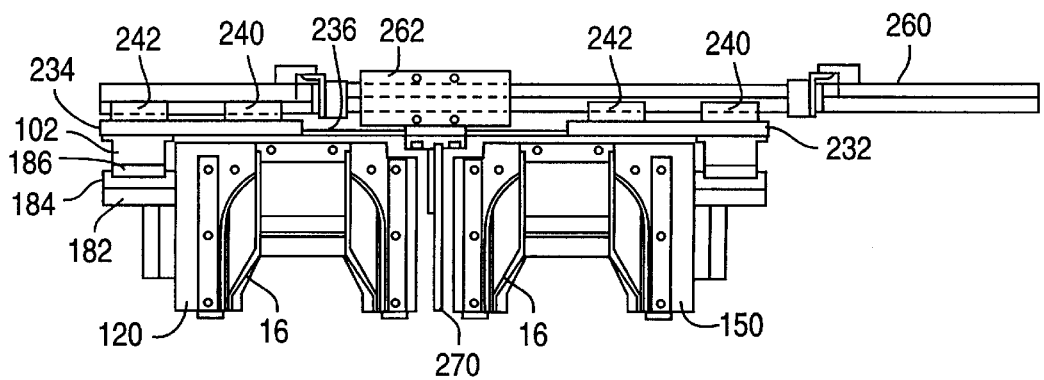

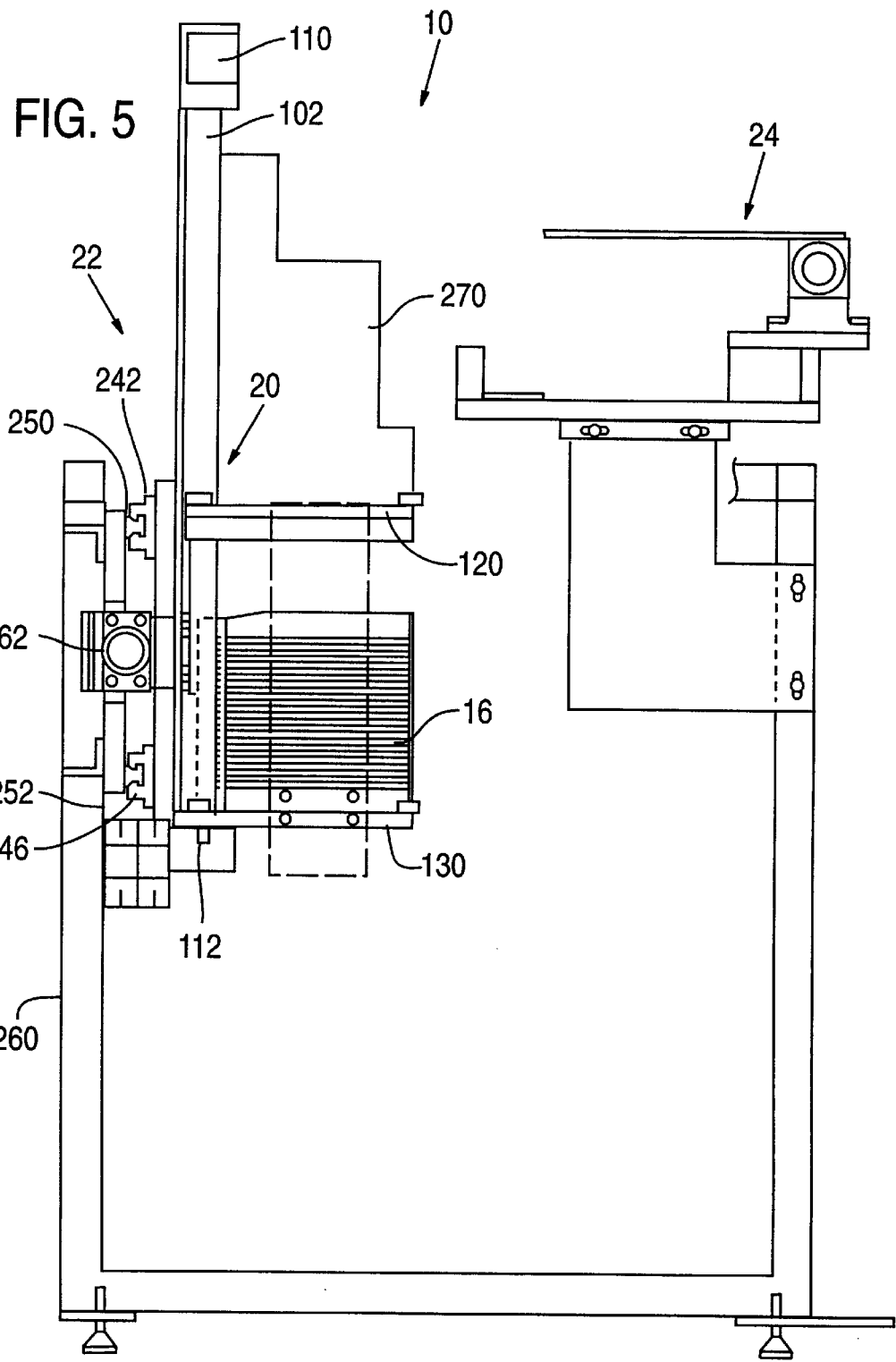

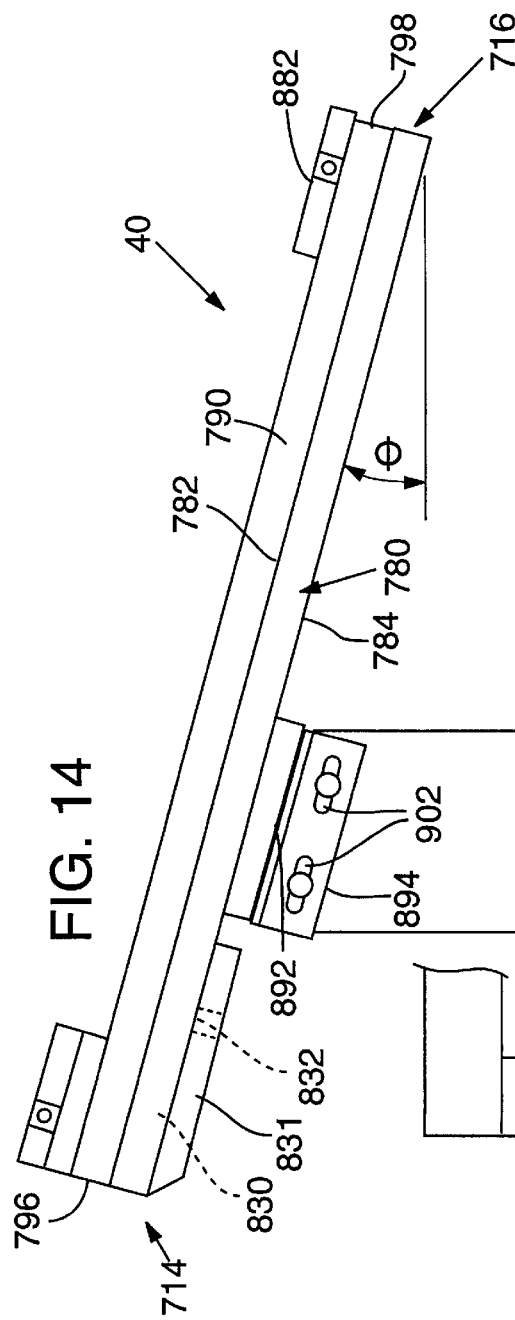
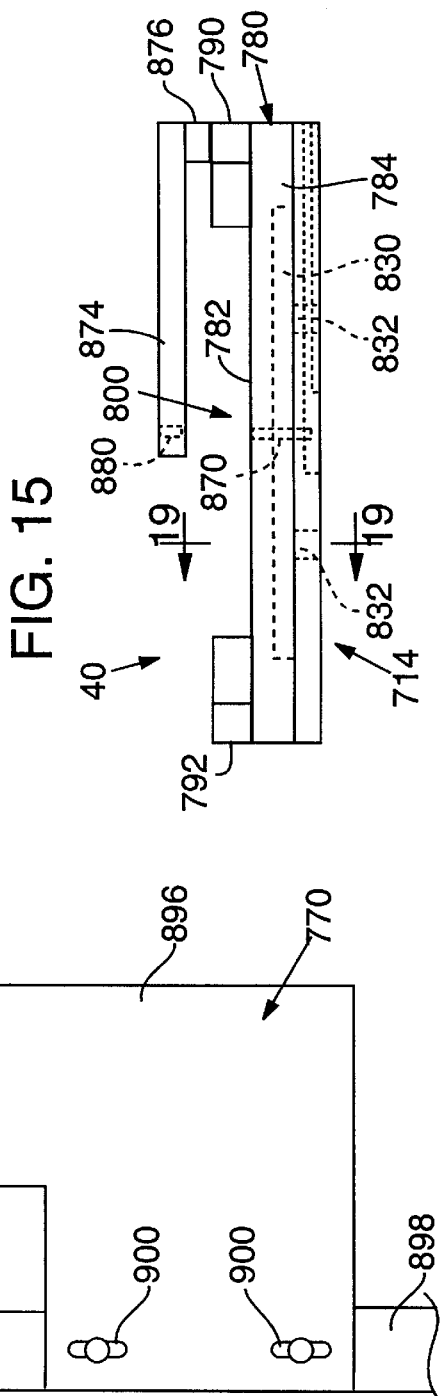

WAFER HANDLING SYSTEM AND METHOD

BACKGROUND OF THE INVENTION

The present invention relates to semiconductor wafer manufacturing and, more specifically, to a wafer handling system and method for transporting wafers during wafer processing.

During semiconductor fabrication, ingots are formed and sliced into wafers. The wafers are processed in many steps that require the wafers to be temporarily stored, transported and positioned. Wafer cassettes are often used for temporary storage and transportation of wafers. Cassettes are typically slotted containers which are open at the top and which have four sidewalls and a bottom. Inner surfaces of two opposing sidewalls are fluted to create slots. Individual wafers are each positioned within a respective slot and are held therein, separated from adjacent wafers. When a cassette is fully loaded, the wafers are located in respective slots and spaced apart from one another so that wafers do not abut.

Wafer containing cassettes are typically delivered to a wafer loading station. At such a station, wafers from the cassettes are loaded, for example onto a conveyor. The conveyor transports the individual wafers to a processing station where a manufacturing step takes place. Following the processing step or steps, the wafers are unloaded from the conveyor and delivered into a cassette at a wafer unloading station.

The loading station typically includes a mechanism for removing individual wafers from the cassette and transferring them to the conveyor. The unloading station also typically includes an unloader for returning the individual wafers to cassettes.

In one known approach, wafers are transferred from a conveyor to waiting cassettes utilizing a water slide unloader which, during operation, provides a continuous sheet of water across the entire slide, regardless of whether a wafer is present on the slide. The slide is tilted downwardly at an angle relative to horizontal so that water will flow down the slide. The water slide of this known construction has a uniformly flat planar bottom surface. As a wafer enters the top of the slide, it is supported entirely from below by the water sheet. Therefore, the undersurface of the wafer, adjacent to the upper surface of the slide, does not come into contact with the slide. Any such contact could scratch or otherwise damage the partially processed wafer. As the wafer travels down the slide, it in effect surfs on the sheet of water. That is, the leading (downwardmost) edge of the wafer is elevated relative to the trailing edge by the water as it travels down the slide. In water slides of this type known to the inventors, substantial quantities of water are caused to flow down the water slide. For example, it is not unusual for these known water slide systems to use one hundred gallons of water per hour or more.

These water intensive systems are disadvantageous because relatively expensive distilled water is typically used in these applications. Moreover, water is becoming a scarcer and more costly resource.

Among the known loaders which remove wafers from the cassette are mechanisms described in U.S. Pat. No. 5,299,901. This latter patent specifically describes mechanisms for removing wafers from cassettes and transferring them to a wafer "boat". Early mechanisms used mechanical tweezers or vacuum tweezers to grip individual wafers and remove them from the cassette and move them. However, these gripper mechanisms could damage some of the wafers. A later transfer mechanism used a "pusher" to push individual wafers up and out of a cassette. A pair of clamps would then grip the wafer and remove it.

In the wafer loader described in the '901 patent, a cassette is attached to a platform and inverted. A wafer boat is located below the inverted cassette. A "lifter" is raised into position below a wafer so that the wafer comes to rest on the lifter. The lifter is then lowered and the wafer, resting on the lifter, descends into the awaiting boat. The wafer is thus loaded from the cassette to the boat.

The wafer transfer mechanism described in U.S. Pat. No. 5,299,901 thereby transfers wafers between devices that can be moved and located vertically atop one another. It does not appear capable of transferring a wafer to another device that is located in a horizontal plane; nor does the transfer mechanism of this patent appear capable of placing a wafer on a horizontal surface. These are some of the limitations that prevent this prior art transfer mechanism from efficiently transferring wafers to some types of work stations and horizontal conveyors.

Another known wafer loader has an elongated arm which is inserted beneath a wafer in a cassette. The arm is removed from the cassette with a wafer coupled to the arm using a vacuum. The arm is then rotated about its longitudinal axis to turn the wafer over for delivery to a second location.

U.S. Pat. No. 5,525,024 discloses yet another form of cassette loader.

Although these prior art wafer handling and transfer mechanisms exist, a need nevertheless remains for an improved wafer handling system and method.

SUMMARY OF THE INVENTION

The present invention provides a wafer handling system and method which loads individual wafers from a wafer cassette onto a conveyor, work table or other location for wafer processing and subsequently unloads individual wafers following processing into wafer receiving cassettes.

Wafer containing cassettes are loaded into a cassette holder of a cassette positioner of a loading station. The cassette positioner shifts the cassettes to position individual wafers in the cassettes into position for extraction by a loader which then places the wafers onto the conveyor or other destination location. Following processing, an unloader retrieves the individual wafers and loads them into cassettes held by a cassette holder of a cassette positioner of an unloading station. The cassette positioner of the unloading station positions the cassettes for receiving the individual wafers from the unloader. The cassettes, after they have been filled with wafers, are removed from the unloading station.

In the preferred arrangement, the cassettes are loaded onto the cassette holder from the rear of the loading station and the loader places the individual wafers onto a conveyor at the front of the loading station. Empty cassettes are also removed from the rear of the loading station. Also, in this construction the unloader retrieves processed wafers from the front of the unloading station with the filled cassettes being removed from the rear of the unloading station. Empty cassettes are also placed onto the cassette holder of the unloading station from the rear of the unloading station. Consequently, in this specific form of the invention, the wafers proceed in one direction through the loading station, the wafer processing stage, and the unloading station.

In a preferred construction of the present invention, the cassette holders and cassette positioners of the loading and unloading stations have interchangeable components to simplify the repair of these subsystems in the event this becomes necessary.

In the wafer handling system of the present invention, the wafer cassette positioners support and shift wafer cassettes having a plurality of wafer holding slots to successively position the respective wafer holding slots at a wafer transfer location. The preferred form of wafer cassette positioner comprises a frame with first and second spaced apart cassette holders coupled to the frame. The first and second cassette holders are each configured to hold at least one wafer cassette with the wafer holding slots of the wafer cassette being generally horizontal. The first cassette holder is coupled to the frame so as to be movable, and most preferably slidable, from a first position to a second position. When in the first position, the at least one wafer cassette supported by the first cassette holder is in a wafer transfer zone. When in the second position, the at least one wafer cassette supported by the first cassette holder is at a second location or cassette transfer zone spaced from the wafer transfer zone. The second cassette holder is also coupled to the frame so as to be movable, and most preferably slidable, between third and fourth positions. When in the third position, the at least one wafer cassette supported by the second cassette holder is in a cassette transfer zone spaced from the wafer transfer zone. When in the fourth position, the at least one wafer cassette supported by the second cassette holder is in the wafer transfer zone.

The wafer cassette positioner also includes an elevator supporting the first cassette holder. The elevator is operable to incrementally index a wafer cassette supported by the first cassette holder upwardly and downwardly to position individual wafer holding slots of the supported wafer cassette at the wafer transfer location when the first cassette holder is in the wafer transfer zone. In addition, the wafer cassette positioner includes an elevator supporting the second cassette holder. This latter elevator is operable to incrementally index the at least one wafer cassette supported by the second cassette holder upwardly and downwardly so as to position wafer slots of the at least one wafer cassette supported by the second cassette holder at the wafer transfer location when the second cassette holder is in the wafer transfer zone.

In the above construction, when the first cassette holder is in the second position, a cassette may be placed into or removed from the first cassette holder. Similarly, when the second cassette holder is in the third position, cassettes may be placed into or removed from the second cassette holder. Conversely, when the first cassette holder is in the first position, individual wafers in a cassette supported by the first cassette holder may be removed from the wafer cassette, if located at the loading station, or inserted into the wafer cassette, if located at the unloading station. In the same manner, when the second cassette holder is in the fourth position, wafers may be inserted into the cassette, if at the unloading station, or removed from the cassette, if at the loading station.

In the illustrated preferred embodiment, at a given time either the first or second cassette holder is in the cassette transfer zone when a cassette holder is in the cassette transfer zone, a filled cassette may be removed from the cassette holder at the unloading station and replaced with an empty cassette. Alternatively, an empty cassette may be removed from the cassette holder at the loading station and replaced with a filled cassette. Simultaneously, while one of the first and second cassette holders is in the cassette transfer zone, the other of the first and second cassette holders is positioned in the wafer transfer zone. When in the wafer transfer zone, wafers are removed from a cassette if the cassette is at the loading station, or inserted into the cassette if the cassette is at the unloading station. As a result, the wafer handling system has enhanced wafer handling capacity.

Most preferably, each of the first and second spaced apart cassette holders carries a stack of at least two wafer cassettes with one wafer cassette in each stack being positioned generally above the other wafer cassette of each stack.

In addition, in a specifically preferred form of the invention, the respective elevators supporting the two stacks of cassettes are independently operable. Therefore, the stack positioned at the wafer transfer zone may be indexed to locate individual wafer cassette slots at the wafer transfer location while the stack at the cassette transfer zone remains stationary or is otherwise independently moved.

The wafer cassette positioner in accordance with another aspect of the present invention includes a sliding support mounted to a frame for lateral or transverse shifting relative to the frame. An actuator is coupled to the frame and to the sliding support. The actuator is operable to laterally shift the sliding support. In addition, the first and second cassette holders are mounted to the sliding support for transverse movement with the movement of the sliding support. The sliding support is shiftable by the actuator in a first direction to shift the first cassette holder from the first position to the second position and to shift the second cassette holder from the third position to the fourth position. More specifically, in the illustrated embodiment, the first cassette holder is shifted from the first position to the second position while the second cassette holder is simultaneously shifted from the third position to the fourth position. In addition, when the first cassette holder is shifted from the second position to the first position, the second cassette holder is simultaneously shifted from the fourth position to the third position. In addition, the first position and the fourth positions are preferably at the same wafer transfer zone while the second and third positions are at opposite sides of the transfer zone.

As yet another aspect of one form of the present invention, each elevator includes an upright guide and at least one wafer cassette supporting platform projecting outwardly away from the guide. Most preferably each elevator includes two spaced apart platforms, one positioned above the other. The elevator platform is indexable along the guide upwardly and downwardly. A wafer cassette supported by the platform is movable with the indexing of the platform to position respective individual slots of the wafer cassette at the wafer transfer location. Most preferably, the platform projects outwardly from the guide such that a wafer cassette may be positioned on the platform or removed from the platform from the rear of the frame without interference by the guide. Consequently, wafer cassettes may be loaded and removed from the rear of the loading and unloading stations.

Any suitable loader may be included in the loading station. However, the loader preferably extracts an individual wafer from a horizontal stack of spaced apart wafers, typically from a wafer cassette. The loader quickly and securely transports the wafer to a desired location, such as to a work station, transfer table or conveyor.

In a specifically illustrated embodiment, the loader transfers the wafer from a cassette to a wafer destination using an arm that detachably couples to the wafer, extracts the wafer from the cassette, inverts the wafer, and delivers the wafer at its destination.

In a specific embodiment of this form of loader, an elongated wafer transfer arm has a longitudinal axis. The arm is positioned so as to place an upwardly facing wafer engaging surface, located at the distal end of the arm, beneath a wafer when the wafer is at the wafer transfer location. The wafer is then detachably coupled to the wafer engaging surface, such as by drawing a vacuum between the wafer and wafer engaging surface. The distal end of the arm is pivoted through a substantial arc and about an arm pivot axis which is transverse or orthogonal to the longitudinal axis of the arm. As a result, the wafer engaging surface and the wafer is flipped over or inverted and moved to a downwardly facing orientation above a second or destination location where the wafer is to be transferred. The wafer is then released from the wafer engaging surface to deposit the wafer at the second location.

The steps performed by the loader are repeated to transfer multiple wafers from the first or wafer transfer location to the second location. In this manner, wafers from an entire or partially filled cassette of wafers are transferred between these locations. When wafers are transferred from a cassette, the arm is positioned at the first location by inserting the distal end of the arm beneath an individual wafer in a stack of spaced apart wafers supported in the cassette. The wafer engaging surface is thus placed beneath a wafer at the first location. The wafer engaging surface is then typically shifted upwardly to engage the wafer with the surface then being coupled to the wafer.

This specific form of loader also most preferably linearly translates the elongated wafer transfer arm to position the wafer engaging surface of the wafer transfer arm beneath the wafer. The arm is then linearly translated in the second direction opposite to the first direction with the wafer detachably coupled to the wafer engaging surface. Consequently, the distal end portion of the arm and the coupled wafer is removed from the stack of wafers. The arm is then pivoted about the arm pivot axis to position the coupled wafer above the second location. In this position, the wafer engaging surface is in a downward facing orientation. The wafer is then released to complete the transfer of the wafer between the first and second locations.

The elevator moves the wafer cassette to index individual wafers into the wafer transfer location for selective coupling to the wafer engaging surface of the arm. Following the extraction of each individual wafer, the wafer cassette is indexed to position the next wafer at the wafer transfer location for retrieval by the wafer transfer arm.

In the illustrated form of loader, the cassette is indexed along a Z axis, which is preferably substantially vertical. In addition, the arm has a longitudinal axis which is typically pivoted in the X-Z plane through about 180 degrees to invert the wafer as it is removed from the cassette and transferred to a conveyor or other destination location. The X-Z plane is preferably substantially vertical.

The unloader at the unloading station may also take any number of forms, including forms known in the prior art. However, a specifically preferred form of unloader takes the form of a water slide which transfers wafers from a first location, such as on a conveyor, to a second location, such as into a wafer cassette held in the cassette positioner at the unloading station.

The preferred form of water slide includes an elongated body with a first end positioned adjacent to the conveyor and a second end positioned adjacent to the cassette positioner. The body is downwardly inclined, or tilted downwardly relative to horizontal, from the first end to the second end. The body includes first and second upwardly projecting side walls which define a wafer guide channel therebetween. The body also includes an upper major surface which defines the bottom of the wafer guide channel. A plurality of elongated water carrying grooves extend lengthwise along the body. These grooves are operable to channel the flow of water within the grooves with a meniscus of water projecting upwardly from the grooves in the absence of a wafer. The meniscus of water is spread from the grooves to wet the upper major surface beneath a wafer when the wafer passes down the water slide along the wafer guide channel.

In accordance with another aspect, the grooves of this form of water slide are most preferably parallel spaced-apart grooves which extend in a direction parallel to the longitudinal axis of the wafer guide channel. The grooves are preferably formed in the upper major surface of the body, such as being recessed into such surface, with portions of the upper major surface adjacent to the grooves being smoother than the grooves. Consequently, water is drawn toward the grooves following the passage of a wafer along the water slide. In this manner, the grooves are more hydrophilic than the lands or portions of the upper major surface adjacent to the grooves. Other ways of making the grooves more hydrophilic than the lands may also be used.

The body of the water slide may have an integral or monolithic base with grooves machined into the upper surface of the base. The upper surface of the base comprises the upper major surface of the body and the ungrooved or land portions of the upper major surface are most preferably in a common plane.

Although more water may be supplied if desired, most preferably less than thirty gallons per hour of water is required and most preferably no more than about fifteen to eighteen gallons of water per hour is required for the preferred form of water slide to operate.

It is accordingly one object of the present invention to provide an improved wafer handling system and method.

It is another object of the present invention to provide a safe and efficient way of transporting wafers through a wafer processing stage.

The foregoing and additional features, objects and advantages of the present invention will become more apparent from the following detailed description, which proceeds with reference to the accompanying drawings. The invention includes both collective and individual aspects of the invention as set forth in the claims.

BRIEF DESCRIPTION OF THE DRAWINGS

FIG. 4 is a top view of the unloading station of FIG. 2, with the water slide shown schematically.

FIG. 5 is a side elevational view of one form of a loading station in accordance with the present invention.

FIG. 6 is a top view of the cassette positioner of the loading station of FIG. 5.

FIG. 14 is a side elevational view of a specific form of water slide unloader usable in the unloading station of FIG. 1.

FIG. 15 is an end view of the water slide unloader of FIG. 14 looking down the water slide from the upper end thereof.

DETAILED DESCRIPTION OF A PREFERRED EMBODIMENT

The present invention has utility in connection with a wafer fabrication process whereby semiconductor wafers are fabricated for eventual use as semiconductor integrated circuits. This fabrication process typically consists of numerous stations where processing steps occur and requires that the wafers be stored, transported and positioned for processing at the various stations.

For purposes of convenience, the description proceeds with reference to an embodiment of the invention shown in the figures. It is to be understood that the invention is not limited to the specific embodiment shown by these figures and described below.

Figure 1:
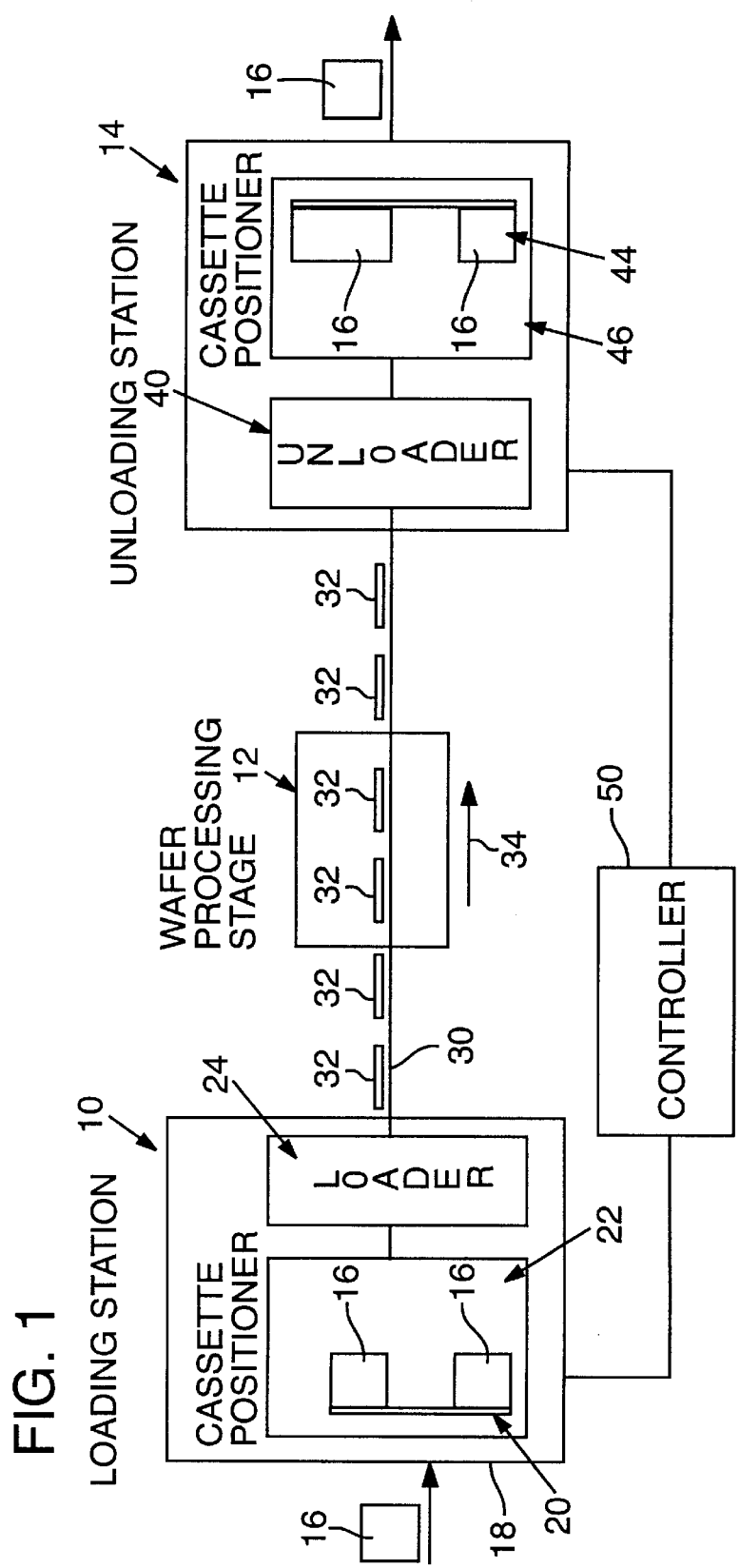
FIG. 1 is a schematic illustration of a wafer handling system in accordance with the present invention.

With reference to FIG. 1, a wafer handling system in accordance with the present invention includes a loading station 10, a wafer processing stage 12, and an unloading station 14.

A wafer cassette 16 containing a plurality of semiconductor wafers is most preferably loaded into the loading station at the rear 18 of the loading station. More specifically, the cassette 16 is placed in a cassette holder 20 of a cassette positioner 22 of the loading station. A plurality of cassettes 16 are shown on the cassette holder. The cassette positioner is capable of moving the cassettes to present individual wafers at a wafer transfer location for removal from the cassette by a loader 24. The loader transfers the removed wafers from a first location, such as from the cassette, to a destination location at a work table or, as indicated in FIG. 1, onto a conveyor 30. in the illustrated embodiment, the wafers are loaded from the front of the loading station onto the conveyor. Individual wafers are indicated at 32 on the conveyor. The wafers are carried in a direction indicated by arrow 34 along the conveyor and through the wafer processing stage 12.

The wafer processing stage is an example of a location where one or more semiconductor manufacturing steps are performed. For example, wafer processing stage 12 may be an inspection station where individual wafers are inspected to verify they are meeting processing standards. As another example, wafer processing stage 12 may be a conventional gettering process or abrasion stage wherein the upper exposed side of the wafers 32 are subjected to a jet of abrasive containing fluid to roughen the exposed surface of the wafer. From wafer processing stage 12, the wafers pass to the unloading station 14.

In FIG. 1, the wafers enter the front end of the unloading station 14 and reach an unloader 40 within this station. Unloader 40 transfers the individual wafers 32 from the conveyor or other location into one or more waiting cassettes 16. The cassettes 16 are supported by a cassette holder 44 within a cassette positioner 46 of the unloading station. The cassette positioner 46 may be like the cassette positioner 22 at the loading station so that parts and components thereof are interchangeable. Consequently, a smaller inventory of repair parts is required to maintain the wafer handling system. In FIG. 1, a cassette 16 is shown being unloaded from the unloading station and more specifically from the rear of the unloading station.

A controller 50 operates in a conventional manner to control the operation of the wafer handling system. Controller 50 controls the operation of cassette positioner 22 to position cassettes and individual wafers contained therein for loading by loader 24 onto the conveyor. In addition, the operation of the loader 24 is also controlled by controller 50. Similarly, controller 50 monitors the unloader 40 and controls the cassette positioner 44 so as to position cassettes for receiving wafers from the unloader. Suitable sensors, such as light-emitting emitters and detectors are used to track wafers as they pass through the wafer handling system. The cassettes are also preferably tracked so that the exact number of wafers are placed in a cassette at the unloading station as removed from a cassette at the loading station. In this way, wafers can be tracked through the manufacturing process. The operation of the controller 50 will be understood as the description of the wafer handling system proceeds.

As can be seen from FIG. 1, in the illustrated wafer handling system, wafer cassettes are loaded into the rear of the loading station 16 where access to the loading station is typically readily available. In addition, individual wafers exit from the front of the loading station. These wafers pass in a common direction from the loading station to the front of the unloading station 14 wherein the wafers are again placed in cassettes which are removed from the rear of the unloading station.

The cassette positioners 22 and 46, as well as the cassette holders 20 and 44, of FIG. 1, are best understood with respect to FIGS. 2–6. The details of construction are the same for the cassette positioner and holder at the unloading station 14 and at the loading station 10. Therefore, the description proceeds primarily with reference to the unloading station 14. For convenience, common elements of the cassette positioners 22, 46 are given like numbers in FIGS. 2–6. It should also be understood that the rear view of the loading station 10 of FIG. 5 is like the rear view of the unloading station 14 shown in FIG. 3.

Figure 2:
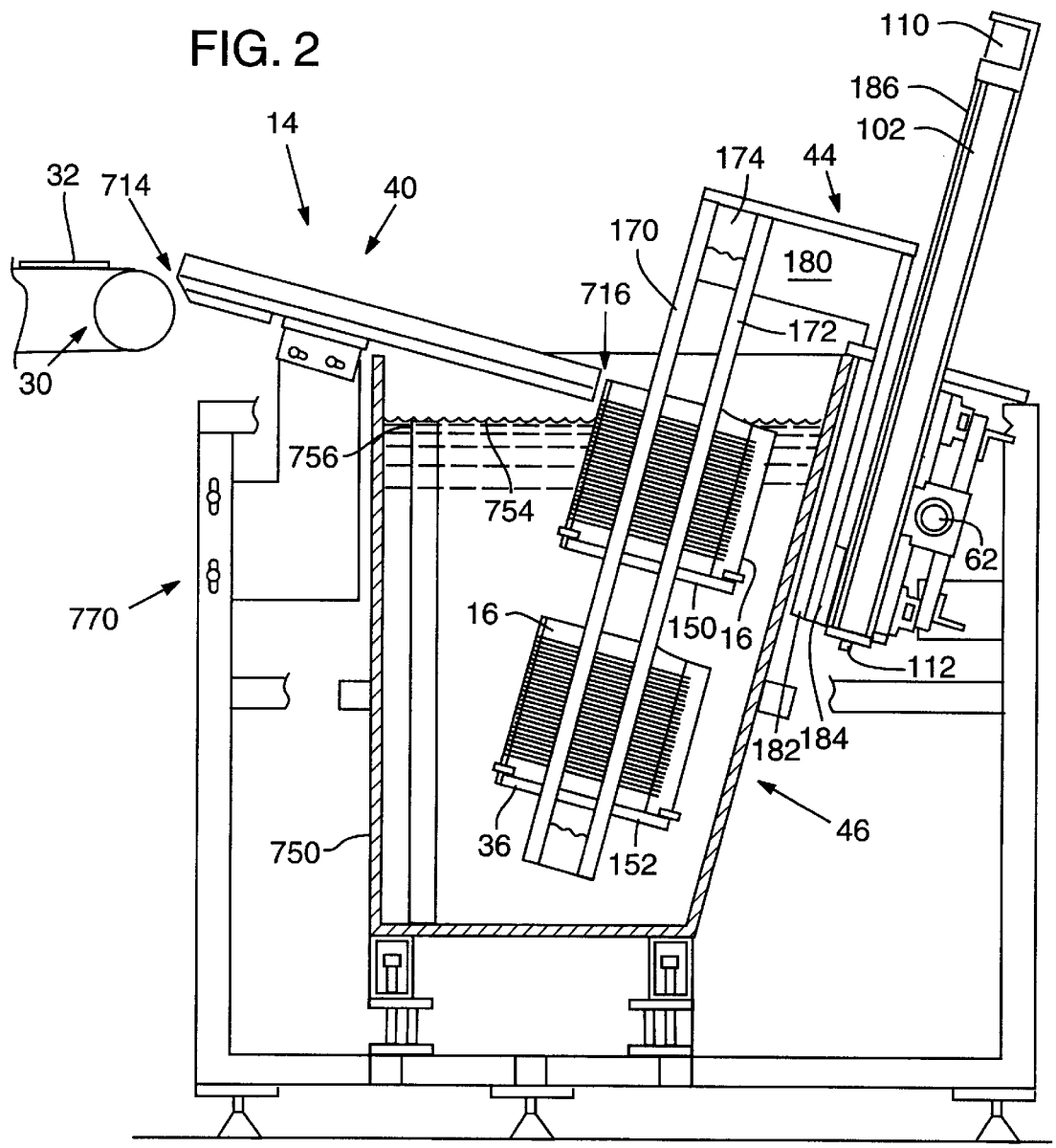
FIG. 2 is a side elevational view of one form of an unloading station in accordance with the present invention and illustrates a cassette positioner with a cassette holder and also showing a specific form of water slide unloader.
Figure 3:
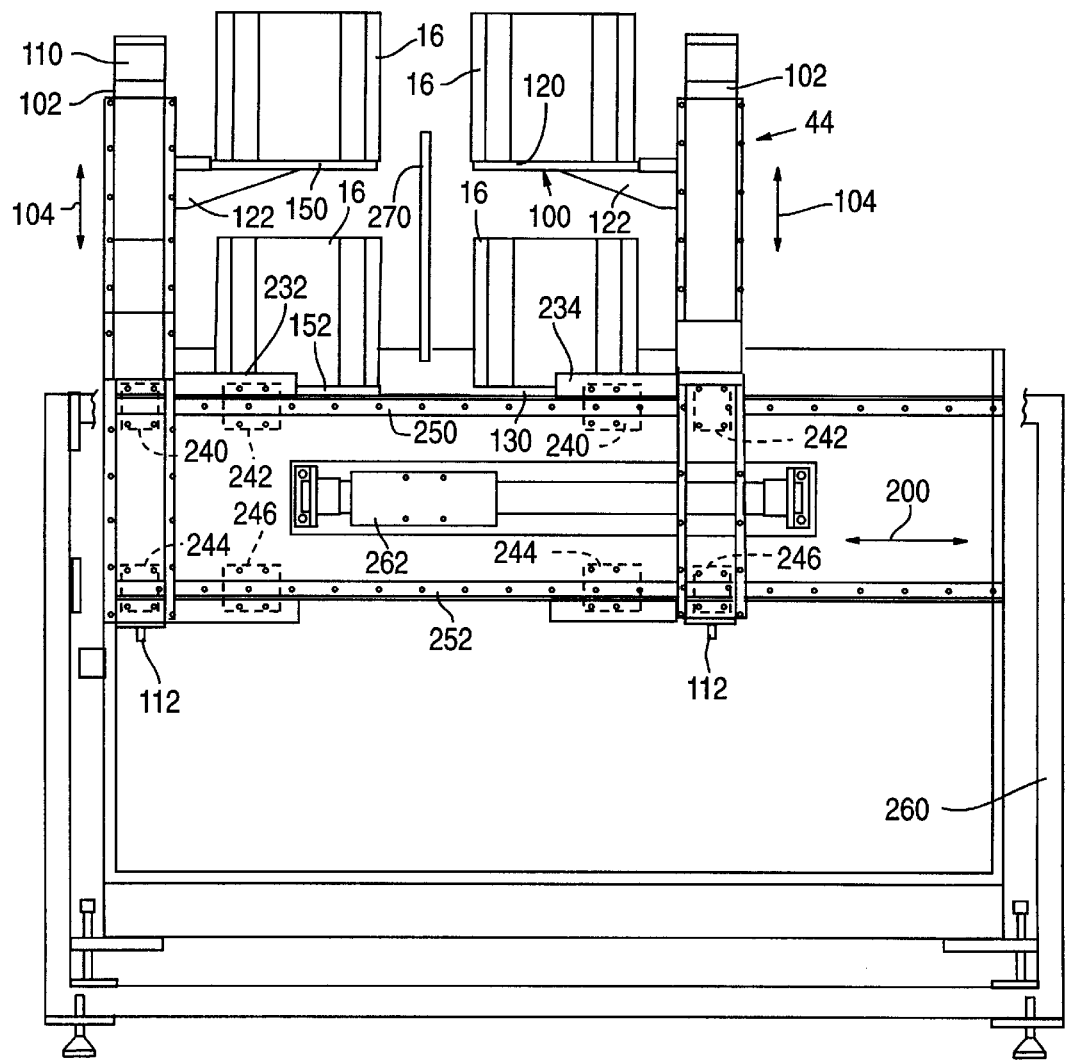
FIG. 3 is a rear elevation view of the cassette positioner of FIG. 2.

As can be seen in FIGS. 2 and 3, the cassette positioner 46 includes at least one cassette holder 44 for supporting at least one cassette 16 and positioning the cassette for receiving wafers delivered thereto by a water slide unloader 40. In the illustrated embodiment, the cassette holder comprises a wafer cassette elevator having a support 100 (FIG. 3) carried by an upright guide 102 for moving upwardly and downwardly in directions indicated by arrows 104. The guide 102 may take other forms, but, in the illustrated embodiment, the guide 102 preferably comprises a ball or lead screw mechanism. A LinTech Model M1-104424-CP ball screw is a specific example. The ball screw is driven by a motor, such as a stepper motor 110. A five-phase Vextra stepping motor, Model PK 569-NAA from Oriental Motor Co. Ltd. of Japan is one form of suitable motor. The operation of the ball screw 102 is controlled by a preprogrammed microprocessor so that precise positioning of the cassette holder 100 along the guide is achieved. An encoder 112, such as a U.S. Digital, Model E3-1000-312 encoder may be used as a feed back device to provide signals indicative of the position of the cassette holder to the controller 50. A conventional motor brake may also be used to stop the motion of the motor and thus the ball screw when the support 100 reaches the desired position. The motor is operable under the control of the controller 50 (FIG. 1) to index wafer receiving slots of the cassette 16 at the wafer transfer position to receive wafers as they travel down the water slide and into the cassette. Consequently, once a wafer is received in a first slot, the cassette 16 is indexed via the operation of motor 110 to position the next slot in position for receiving a wafer. At the loading station 10, the cassette is indexed by the cassette holder 20 to position a wafer at the desired transfer location for removal of the individual wafer from the cassette.

The illustrated cassette holder 100 comprises a platform 120 projecting outwardly from the guide 102. Reinforcing gussets, one being indicated at 122 in FIG. 3, are provided to strengthen and rigidify the platform 120 from below.

As also best seen in FIG. 3, the illustrated preferred form of cassette holder 44 includes a stack of cassette holders or platforms so that a plurality of cassettes, in this case two cassettes 16, are supported in stacked alignment with one another. Each of the platforms is coupled to the guide 102. Thus, in FIG. 3, a second platform 130 is shown supporting a second cassette 16 below the platform 120. The platforms 120, 130 in the illustrated embodiment move together in unison along the guide 102. This construction doubles the capacity of the system as in effect two cassettes may be filled (or partially filled, if desired) with wafers by indexing the platforms 120, 130 to position respective slots of the cassettes at the wafer transfer location.

As also can be seen from FIG. 3, the platforms 120, 130 project outwardly a sufficient extent to permit the placement onto and removal of cassettes from the platforms from the rear of the cassette holder 44 without interference by the guide 102. Therefore, an operator need not travel to the sides or front of the unloading station to accomplish this task. Consequently, efficient loading and unloading of cassettes can readily be achieved.

As can also be seen from FIG. 3, the cassette positioner includes a second cassette holder which supports a second stack of platforms 150, 152. Platforms 150, 152 are supported and indexed in the same manner as platforms 120, 130. Components which support platforms 150, 152 and index these platforms which are the same as those used in connection with platforms 120, 130 are given the same numbers in FIG. 3 for convenience and therefore will not be described in detail.

With reference to FIGS. 2 and 4, each platform is supported by a pair of gussets (see gussets 122 in FIG. 3) which project outwardly from flanges 170, 172 of a platform carrying I-beam support. The I-beam support has a web 174 which extends between the flanges 170, 172. The I-beam support is connected at its upper end to a crosspiece 180. The crosspiece 180 has a downwardly projecting leg portion 182. The leg portion 182 is coupled to a linear bearing block 184 which is mounted to a linear bearing 186 which extends from the bottom to the top of the guide 102. The linear bearing is included in the LinTech ball screw mechanism mentioned above. Bearing block 184 travels upwardly or downwardly along bearing 186 in a linear direction as the motor 110 is operated. As the bearing block travels, the platforms 120, 130, 150, 152 are thereby raised and lowered to index the wafer cassettes 16 as required. As can be seen in FIG. 2, the platforms 150, 152 and supported cassettes 16 are supported at an angle which matches the angle of the particular water slide unloader 40 shown in FIG. 2.

In the illustrated embodiment, the respective stacks of platforms 120, 130 and 150, 152, and any cassettes 16 supported by the platforms, are transversely shiftable in directions indicated by arrows 200 to respectively position each stack at a first location or wafer transfer zone in front of the water slide unloader 40 (FIG. 4) or a wafer loader 24 (FIG. 5), depending upon whether the cassette positioner is at the wafer unloading station or loading station.

In FIGS. 3 and 4, the right hand-most stack, containing platforms 120, 130, is shown in a wafer transfer zone in front of the water slide unloader 40. In addition, the left hand-most stack, containing the platforms 150, 152, is shown in a cassette transfer zone to the left of the water slide unloader. When platforms 150, 152 are in this latter position, filled or partially filled cassettes 16 on these platforms may be removed from the rear of the unloading station and replaced with empty cassettes. Platforms 120, 130 may be indexed along guide 102 independently of the indexing of platforms 150, 152, along their associated guide 102. Therefore, while the unloading/reloading of cassettes is taking place from the platforms 150, 152, the cassettes 16 on platforms 120, 130 may be indexed to receive additional wafers traveling down the water slide unloader. In the case of the loading station, the platforms 120, 130 are indexed to position cassettes for removal of individual wafers from the cassettes by the loader 24 (FIG. 5). After the cassettes supported on platforms 120, 130 have been filled to the desired extent at the unloading station (or emptied, if at the loading station) the assembly is shifted to the right in FIGS. 3 and 4. This positions the stack of cassettes supported by platforms 150, 152 in the wafer transfer zone. The slots of these cassettes may then be respectively indexed to the wafer transfer location to receive wafers traveling down the water slide unloader 40 (or for removal of the wafers by unloader 24, FIG. 5). This shifting of the position of the stack containing platforms 120, 130 is shown schematically by dashed lines indicated at 204 in FIG. 4. When in this right hand-most position, the cassettes 16 supported by platforms 120, 130 may be removed from the rear of the unloading station and replaced with empty cassettes. Similarly, if at the loading station, the empty cassettes are removed from platforms 120, 130 and replaced with full cassettes. At the same time, the platforms 150, 152 are indexed as appropriate and independently of the motion of platforms 120, 130. Consequently, processing efficiency is increased as cassettes may be unloaded and loaded into the respective cassette positioners 22, 44 at the loading and unloading stations while continued transfer of wafers from cassettes at the loading station and to cassettes at the unloading station takes place.

The transverse shifting of the cassette holders may be accomplished in any convenient manner. In the illustrated form, the guides 102 are coupled to a sliding platform 230 (FIGS. 3 and 4) in a manner that permits the indexing of the guides, and thereby the supported cassettes, while simultaneously permitting the sliding platform 230 to move in the directions indicated by arrows 200 (FIG. 3). The illustrated sliding platform 230 includes first and second end platform sections 232, 234 rigidly interconnected by a central section 236. Platform section 232 carries a set of two upper bearing blocks 240, 242 and a set of two lower bearing blocks 244, 246. Similar bearing blocks 240–246 are carried by the platform section 234. These bearing blocks are respectively coupled to upper and lower bearing rails 250, 252 mounted to the frame 260 of the unloading station (or loading station, in FIG. 5). Consequently, the platform 230 easily slides in either direction indicated by arrows 200 along the rails.

A cylinder 262 is coupled between the frame 260 and the platform 232 and operates in response to the controller 50 (FIG. 1) to transversely shift the platform. The platform is shifted in response to the controller 50 to position the desired stack of cassettes either in the wafer transfer zone or the cassette transfer zone. One suitable cylinder is pneumatic with an air actuated positioning cylinder being a specifically preferred type of cylinder. A model DGO-40-350-PPV-15226 positioning cylinder from Festo Corporation is a specific example of a suitable air positioning cylinder.

As also can be seen in FIGS. 3, 4 and 5, a divider 270 is mounted to the platform section 230 and projects outwardly between the stacks of cassettes to screen the respective cassettes from one another and for operator safety.

Figure 7:
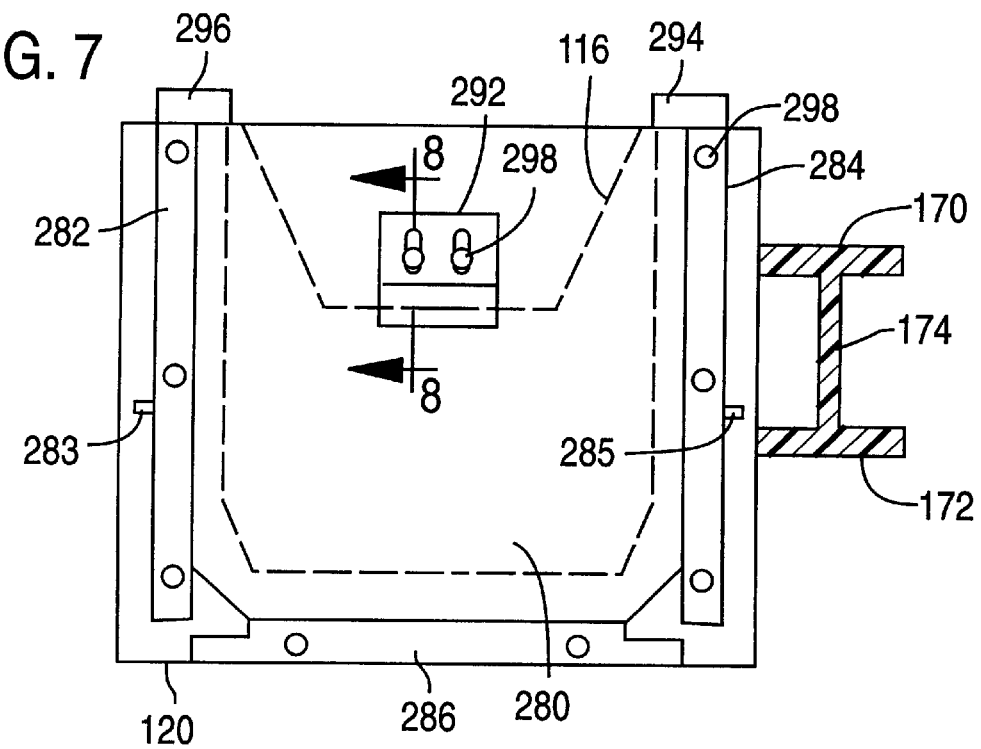
FIG. 7 is a top plan view of a form of cassette supporting platform included in the cassette positioners of the unloading and loading stations of FIG. 2 and FIG. 5.
Figure 8:
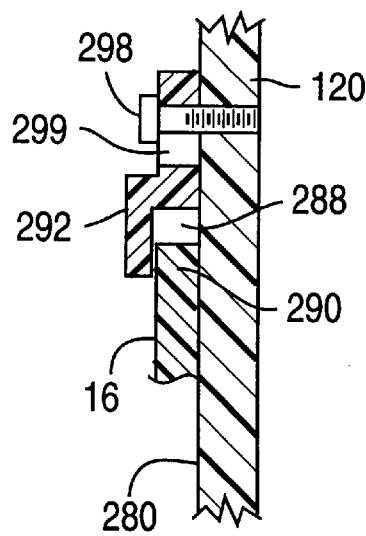
FIG. 8 is a vertical sectional view taken along line 8—8 of FIG. 7.

The platforms 120, 130, 150, 152 securely retain the cassettes thereon. With reference to FIGS. 7 and 8, one of the platforms, specifically platform 120, will be described. The platform 120 includes a planar upper surface 280 on which the cassette 16 is placed. A pair of side cassette retention elements 282, 284 and a rear retention element 286 is mounted to the platform. A front retainer 292, having an undercut front edge 288 (FIG. 8), is mounted to the platform 120. A respective flange of the cassette 16 fits under the undercut edge 288 of element 292 when the cassette is in position. Typically, these elements, as well as the platforms and I-beam support, are of a durable plastic material such as natural polypropylene. The retention elements 282 and 284 have respective inwardly directed flanges 294 and 296 which act as stops for the edge of the cassette, as can be seen in FIG. 8. Mechanical fasteners 298, which are also typically of a natural polypropylene, may be used to secure the retention elements to the platform. Typically, an elongated slot 299 is provided in element 292 to permit adjustment of this retention element toward and away from the element 286. A cassette 16 rests on the platform 120 bounded by elements 282, 284, 286 and 292.

Figure 9:
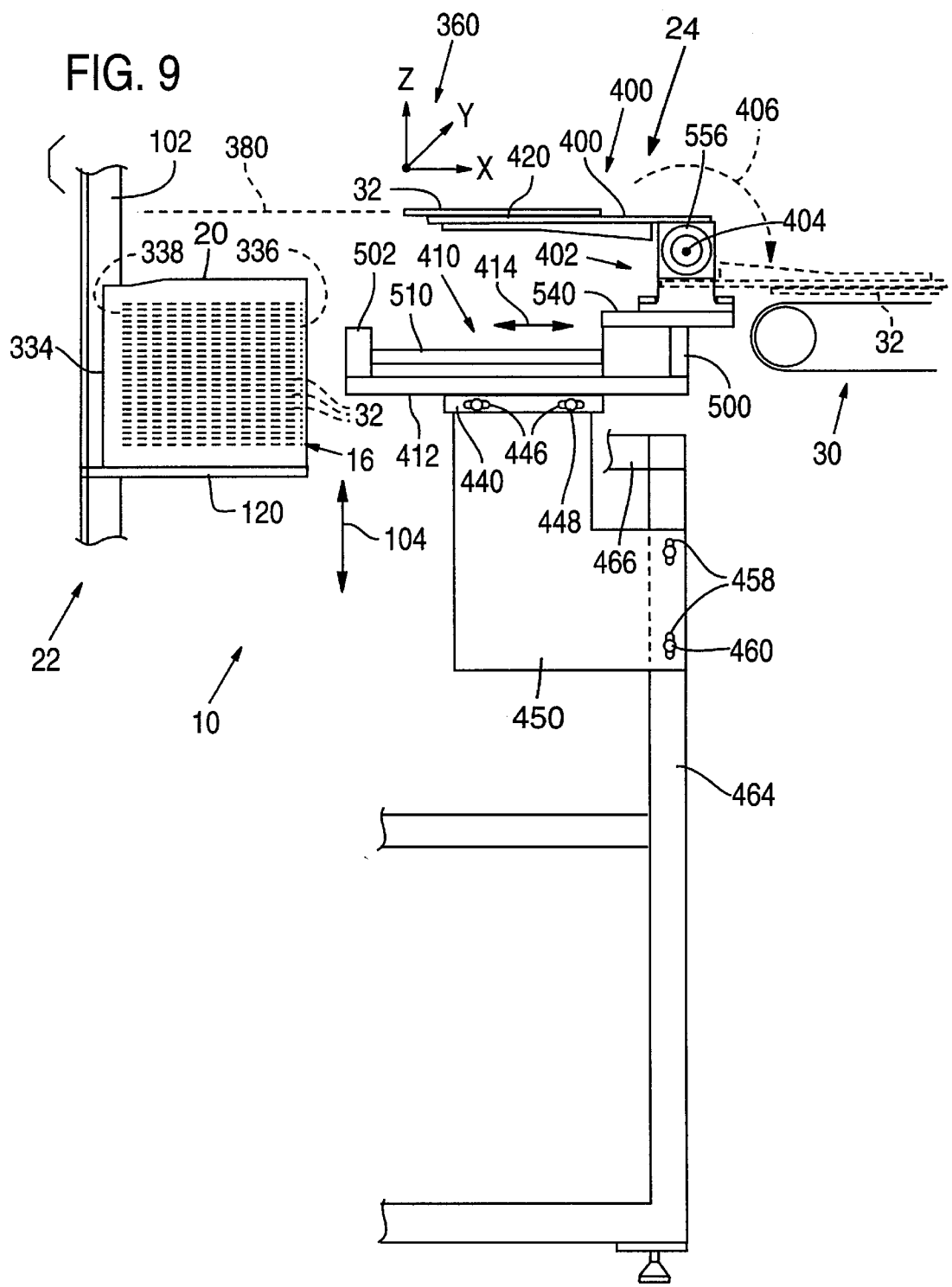
FIG. 9 is a side elevational view, partially in schematic form, of one specific form of a wafer loader usable in the loading station of the present invention.

With reference to FIG. 9, a wafer loading station 10 is shown and includes one specific preferred form of wafer loader 24 for shifting semiconductor wafers from station 10 to a location where further processing can take place. Again, other alternative loaders may be used instead of the loader shown in FIG. 9. In FIG. 9, a semiconductor wafer 32 is shown being moved from the loading station 10 to the conveyor 30 which carries the wafer to a location where additional semiconductor wafer processing takes place.

In FIG. 9, a wafer cassette 16 is shown supported by the platform 120 in the wafer transfer zone. Although not shown in detail, wafer cassette 16 is well-known in the art and typically has four sides, a bottom 334 and a top 336 (the cassette 16 being shown rotated 90 degrees in FIG. 9 so that the top 336 is in a vertical orientation). The top 336 is open so that horizontally oriented wafers 32 may be loaded from the cassette through the open top. The semiconductor wafers are each received in a respective set of opposed grooves. Each set of grooves holds an individual wafer. The stack of wafers positioned in a wafer cassette are supported in the respective grooves in a spaced-apart relationship so that a gap is provided between each of the wafers when contained in the cassette. One such gap is indicated at 338 in FIG. 9.

Any convenient mechanism may be used to position cassettes at the desired location so that the wafer loader 24 may retrieve an individual wafer 32 from the cassette and transfer it to the conveyor 30. In FIG. 9, a cassette holder in the form of the above-described elevator is illustrated for this purpose. Thus, the platform 120 is coupled to the guide 102, which again may comprise a conventional ball screw mechanism driven by a stepper motor. As the ball screw is rotated, the platform is raised or lowered, as indicated by the arrows 104, depending upon the direction of rotation of the ball screw.

In the embodiment of FIG. 9, the operation of the illustrated loader 24 may be understood with reference to an X-Y-Z three-dimensional coordinate system indicated at 360. In this system, respective X, Y and Z axes are orthogonal to one another. Also, although this can be varied, in the illustrated embodiment the Z axis is vertical, the X axis is horizontal, and the X-Z plane is vertical. In addition, the elevator indexes the cassettes in a direction 104 which is most preferably vertical, and thus along the Z axis. Thus, with reference to this coordinate system, the transverse motion of the cassette holders indicated by arrows 200 (FIG. 3) is along the Y axis.

Actuation of the guide 102 causes it to raise or lower the associated platforms (e.g. platform 120 in FIG. 9) and thereby the supported cassette 16. The cassette 16 is thereby shiftable to place slots of the cassette at a wafer transfer location, which in the FIG. 9 loader is at a location where the undersurface of the first wafer in the cassette to be transferred is at an elevation slightly above a pre-determined height, which is indicated at 380 in FIG. 9. When at this height, the wafer may be engaged by the wafer loader 24, as described below. Thereafter, the elevator raises (or lowers) the cassettes 16 so that a second wafer in one of the cassettes is positioned at the desired height for engagement with and transfer by the wafer loader. Similarly, after one cassette (e.g. an upper cassette in the stack of cassettes) is empty, the elevator may shift the second cassette in the stack to position wafers at the wafer transfer location such that wafers in the second cassette may individually be removed by the wafer loader. The elevator or cassette holder 20 may be operated to index the cassettes to permit unloading of wafers starting from the uppermost wafer of the upper cassette of the stack and moving toward the bottom of the cassette, starting from the lowermost wafer at the bottom of the lowermost cassette moving toward the top of the cassette, or in any other desired order.

Any suitable cassette positioner 22 which positions the wafers at the desired elevation for handling by the wafer loader 24 may be used. As shown in FIG. 9, the wafers 32 are indexed with their undersurface in a generally horizontal plane. However, it is possible that the cassettes may be tilted and the wafer loader operated to transfer wafers that are tilted from horizontal.

The purpose of the loader 24 is to remove individual wafers from the wafer cassette 16 and to transfer the individual wafers to a destination which, again, may be the conveyor belt 30, a water slide, or a work station (not shown).

Figure 10:
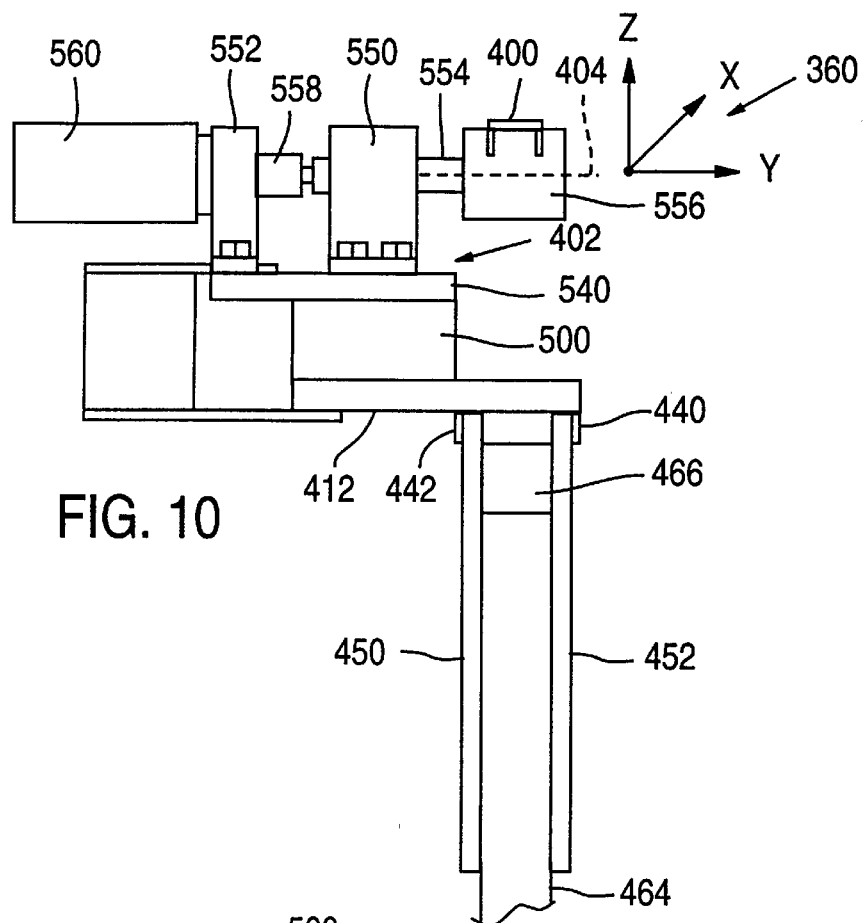
FIG. 10 is a rear elevational view of the wafer loader of FIG. 9.
Figure 11:
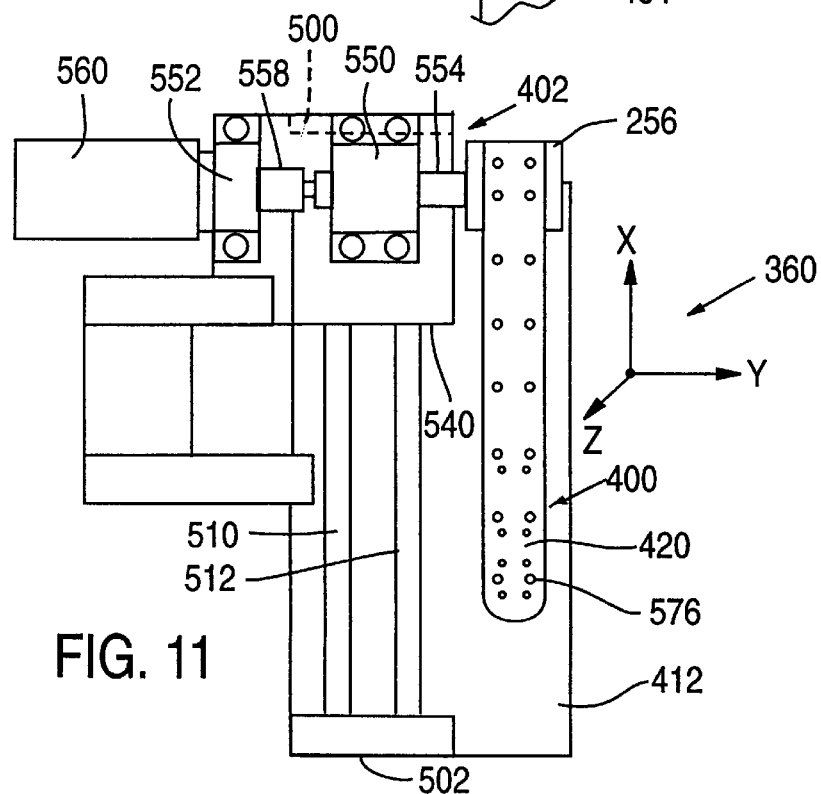
FIG. 11 is a top plan view of the wafer loader of FIG. 9.

With reference to FIGS. 9–11, one preferred form of a wafer loader 24 usable in the system of the present invention will be described. More specifically, the illustrated wafer loader includes an elongated arm 400 pivoted to a platform 402. The arm is mounted for pivoting about an axis 404, as indicated by an arrow 406, between a first position shown in solid lines in FIG. 9, and a second position shown in dashed lines in FIG. 9. Thus, with reference to the coordinate system 360, the longitudinal axis of the arm 400 in this embodiment travels in the X-Z plane when shifting between the first and second positions.

The platform 402 is also movably coupled by a coupling mechanism 410 to a base 412 so that the platform is movable in opposite directions as indicated by the arrows 414. Again, with reference to the coordinate system 360, the platform 402 of this embodiment is linearly translated in opposite directions along the X axis. Because the arm 400 is supported by the platform 402, the arm also translates with the translation of the platform. Consequently, from the position shown in FIG. 9, the platform may be moved linearly toward a wafer positioned at the elevation 380 so that the distal end of the arm is placed beneath the undersurface of the wafer. A detachable coupling mechanism, such as a vacuum mechanism described in greater detail below, is then activated to couple the wafer to a wafer engaging or supporting surface 420 of the elongated arm. The platform may then be translated linearly in the opposite direction to extract the now coupled wafer from the wafer cassette 16. After the wafer clears the wafer cassette, the arm is pivoted about the axis 404 to place the wafer at a destination location such as shown in dashed lines in FIG. 9. The wafer then may be decoupled from the arm, for example by relieving the vacuum, to deposit the wafer at the destination location.

The illustrated base 412 includes a pair of downwardly projecting mounting flanges 140, 142 (FIG. 11), each having a pair of spaced apart horizontally extending elongated mounting slots 446 (FIG. 9). Bolts or other fasteners, one being indicated at 448 in FIG. 9, are inserted through the slots 446 and through upright base support flanges 450, 452 (FIG. 10) to rigidly fix or mount the base 412 to the support flanges. The support flanges each include respective vertically extending elongated slots 458 (FIG. 9) through which mechanical fasteners, such as bolts 460 (one being numbered in FIG. 9), are inserted to mount the flanges 450, 452 and thereby the base 412 and supported wafer loader 24 to an upright frame member 464 of the loading station 10. The elongated slots 446, 458 permit respective horizontal and vertical positioning adjustment of the base 412 and thereby of the wafer loader. A frame crosspiece 466 passes between the flanges 450, 452 and provides further rigidity to the construction.

The base 412 includes upwardly projecting end plates 500, 502 which are located at the respective ends of the base.

The coupling mechanism 410 may take any convenient form which permits the desired motion of the platform relative to the base 412 and most preferably which permits linear translation of the platform relative to the base. The illustrated coupling mechanism includes first and second guide rails 510, 512 (FIG. 11) which are supported by the respective end plates 500, 502. The platform 402 is slidably carried by the rails 510, 512 for movement toward and away from the cassette positioner 22 along the X axis. The end plates 500, 502 act as stops or bumpers to limit the motion of the platform 402.

The illustrated platform 402 includes a horizontal arm support plate 540 mounted to a slide block 542. The slide block is slidably mounted to the rails 510, 512. Although bearings may be used for coupling the slide block to the rails, typically bearings are not used. Instead, the slide block is typically made of a friction reducing material such as Teflon plastic, nylon or other such material so that it slides freely on the rails 510, 512. In addition, the rails are typically made of polished stainless steel to facilitate this sliding motion. A pneumatic cylinder or other actuator, not shown, is activated to move the slide block 542 and thereby the arm support plate 540 toward and away from the cassette holder 20. Instead, the slide block 542 may be an air actuated positioning cylinder block, such as from Festo Corporation.

A bearing support block 550 (FIGS. 10 and 11) and a motor support block 552 are mounted to the arm support plate 540 and thus to the movable slide block 542. The bearing support block 550 supports shaft bearings (not shown) which in turn support a shaft 554. The shaft 554 is coupled to an arm block 556 at an outboard end of the shaft and drivenly coupled to a motor shaft coupling 558 at its inboard or opposite end. The coupling 558 is mounted to the shaft output of a motor 560 which is supported by the motor support block 552. A motor 560 is one form of a suitable actuator for pivoting the arm 400 about the pivot axis 404. In the illustrated embodiment, the motor comprises a servomotor which precisely controls the rotation of the shaft 554 and thus the arm 400.

The arm 400 is mounted to the arm block 556 for movement with the motion of the arm block and, because the arm block moves with the shaft, the arm 400 moves correspondingly with the motion of the shaft 554. Actuation of the motor 560 to rotate in a first direction drives the shaft 554 in the first direction, which in turn rotates the block 556 and arm 400 in the first direction. Conversely, rotation of the motor 560 in the opposite direction causes the arm 400 to pivot in the opposite direction.

An illustrated preferred embodiment of the arm 400 is shown in FIGS. 12A–12D. The arm 400 includes a proximate or first end portion 562. End portion 562 is mounted by mechanical fasteners (not shown) extending through openings 564 (two of which are numbered in FIG. 12A) into the arm mounting block 556. The distal end 566 of the arm 400 includes the wafer engaging surface 420 along the upper surface of the arm. The illustrated arm 400 includes a first upper arm section 570 and a second lower arm sections 572. The wafer engaging surface 420 is provided at the upper side of the arm section 570. The surface 420 in the preferred embodiment is generally planar. The wafer engaging surface is made of a material which minimizes damage to the engaged wafer surface. For example, the surface 420 may be of anodized aluminum with an optional wafer surface protective coating, such as Teflon plastic. The arm sections 570, 572 are also preferably of this material although they may be of other durable materials. The arm section 570 includes a vacuum cavity 574 extending along its length. The vacuum cavity 574 communicates through the plate 572 via a port 577 located at end 573 of the arm. The port 577 is in fluid communication with a vacuum source. The chamber 574 is otherwise closed from below by the arm section 572.

A plurality of vacuum ports, some being numbered as 576 in FIGS. 12A–12D, communicate between the semiconductor wafer supporting surface 420 and the chamber 574. Consequently, when a semiconductor wafer is engaged by the wafer supporting surface 420 and a vacuum is drawn in the chamber 574 via the port 577, a vacuum is correspondingly drawn at the apertures 576. This vacuum detachably couples the wafer to the arm. Typically, a vacuum of 24 to 27 inches of water is drawn to securely hold the semiconductor wafer in place. Following pivoting of the arm to the destination location, the vacuum is relieved to allow the semiconductor wafer to decouple from the arm at the destination location.

Mechanical fasteners, not numbered in FIGS. 12A–12D, are typically used to secure the arm sections 570, 572 together. In addition, reinforcing gussets 580, 582 extend from a location adjacent the proximal end 572 of the arm to a location approximately midway along the length of the arm. The gussets 580, 582 help to rigidify the arm structure. The gussets terminate short of the proximate end of the arm 400 to provide an arm block receiving notch 579 which abuts the arm block 556 when the arm is mounted in place.

Figure 12A:
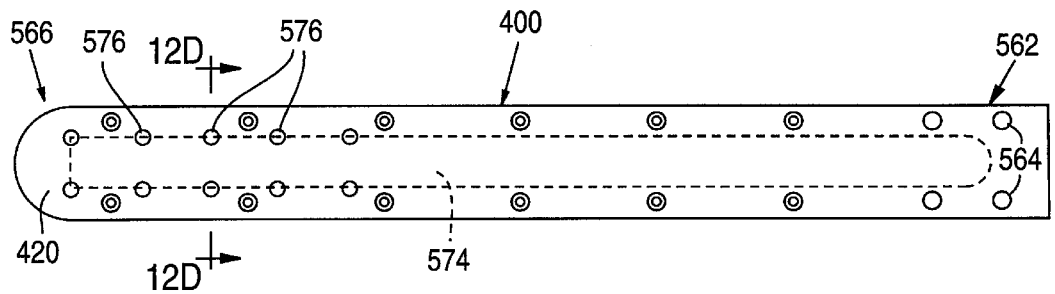
FIGS. 12A–D are, respectively, a top plan view, a side elevational view, a partially broken away bottom view, and a vertical sectional view of a wafer transfer arm used in the wafer loader of FIG. 9.
Figure 12B:
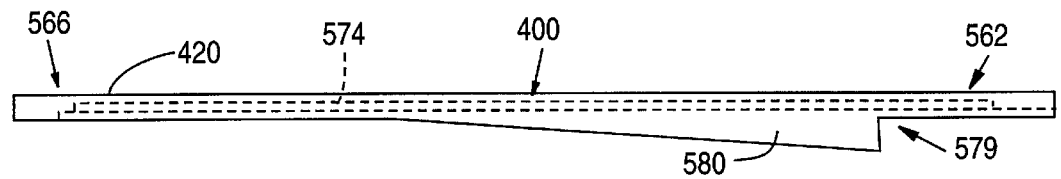
Figure 12C:
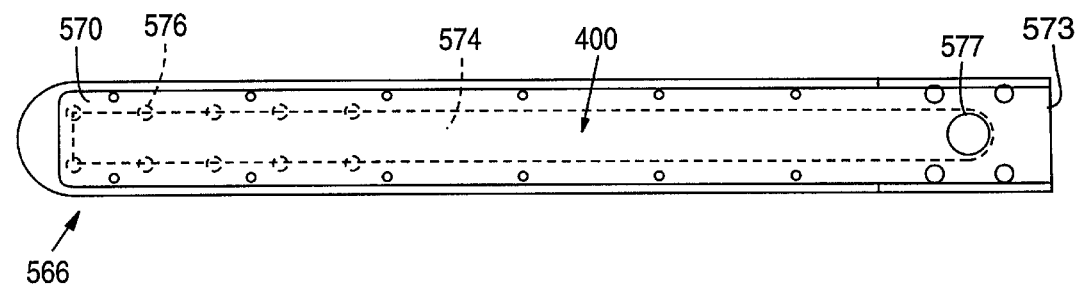
Figure 12D:
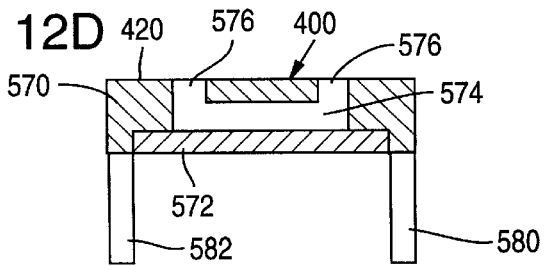

With this construction, as can be seen in FIG. 12B, the distal end portion of the arm 400 is very thin and plate-like. In one specific embodiment, the thickness of the distal end of the arm between the opposed major surfaces is about 0.20 inch to 0.27 inch. Consequently, the arm may be inserted into the gap between semiconductor wafers as the wafers are being extracted from a wafer cassette.

Although the illustrated embodiment of the arm 400 is advantageous, other arm shapes and constructions may be used. In addition, other coupling mechanisms may be used for engaging and removing wafers from a wafer cassette.

Figure 13:
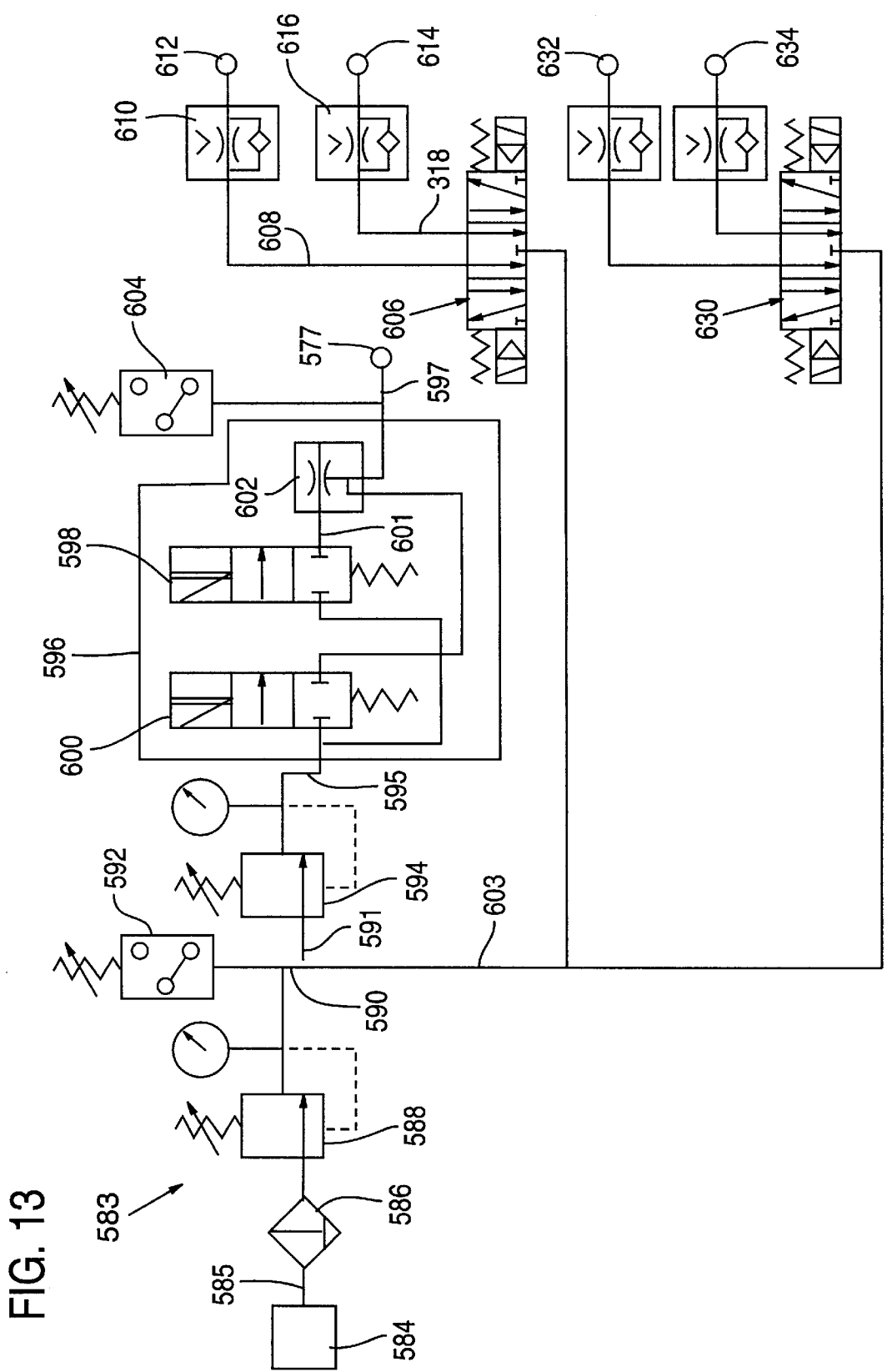
FIG. 13 is a schematic diagram of a pneumatic system used in the wafer handling system of FIG. 1.

A suitable pneumatic system 580 for the wafer handling system is shown in FIG. 13. A source of pressurized air 584 provides pressurized air into a pneumatic line 585. From the source of pressurized air 584, the air flows to an air filter and dryer 586 and then to a filter and regulator 588. Thereafter, the air splits along three paths at a junction 590, with a portion of the air flowing into a pressure switch 592. The pressure switch 592 is provided for the purpose of monitoring the air pressure at junction 590 and signaling the controller 50 when the air pressure is too low for the desired operation of the wafer handling system. Another airflow branch 591 from junction 590 passes to a regulator 594 and then via a line 595 to a vacuum generator 596 that is pneumatically coupled via a line 597 to the port 577 (FIG. 12C) of the arm 400. The vacuum generator selectively provides a partial vacuum in the channel 574 so that air is drawn in through the apertures 576 for purposes of holding a wafer on the wafer supporter surface 420.

To generate a vacuum at the port 577, a two-way/two-position valve 598 (FIG. 13) is operated to provide a flow path through the valve 598 between lines 595 and 597. At this time, another two-position/two-way valve 600 is operated to block the flow of air through this valve. Air passing through valve 598 flows through a main air passage 601 of a venturi type vacuum generator 602 which causes a vacuum to be drawn at line 597 and then at the port 577. A pressure switch 304 is also provided for the purpose of detecting a vacuum in the line 597, which results when a wafer is coupled to the arm surface 420. Switch 504 indicates the presence of the wafer to the controller 50. When a vacuum is drawn at port 577, a wafer is detachably coupled to the distal end of the arm 400. After the arm is pivoted to the destination location, the valve 598 is shifted to the position shown in FIG. 13, airflow through valve 598 between lines 595 and 601 stops, and the vacuum is relieved. To assist in decoupling the wafer, at this time the optional valve 600 is briefly shifted to provide a flow path through this valve between lines 595 and 597 and to the port 577. This permits a short burst of air (a puff) to be delivered to the port 577, the channel 574 (FIG. 12A) and then to the outlets 576 to assist in decoupling the wafer from the arm 400. For example, the pulse of air may be delivered for a time period of 0.5 to 1.5 seconds.

Returning to the junction 590, a third leg 603 for air flow passes to a platform shifting solenoid controlled valve 606. The valve 606 is operable to control the delivery of air to an air cylinder used as an actuator to move the platform 402 (FIG. 9) toward and away from a wafer cassette. The illustrated solenoid controlled valve 606 (FIG. 13) is a four-way, three-position valve. This valve is biased to its middle position as shown, which blocks the pneumatic line 603 and thus the flow of air through the valve. When the valve is operated to shift to the right in FIG. 13, air flows through the valve from line 603 to a line 608 and through a flow control valve 610 to a port 612. The port 612 is coupled to one side of a pneumatic cylinder or air actuated positioning cylinder utilized to move the platform 402 (FIG. 9). In response to this air supply, the platform 402 is moved in a first direction along the X axis, for example toward the waiting wafer cassette. At the same time, air at the opposite side of the air cylinder is vented through a port 614, a flow control valve 616, a line 618 and the valve 606. Consequently, as air is supplied to one side of a pneumatic cylinder to move the platform, air is relieved from the other side of the pneumatic cylinder. Conversely, when valve 606 is shifted to the left in FIG. 13, air is delivered through the valve 606 from line 603 to the line 618, through the flow control valve 616 and through the port 614 to the opposite side of the pneumatic cylinder to thereby move the platform 402 in the opposite direction. Simultaneously, air from the opposite side of the cylinder is vented via a path through port 612, flow control valve 610, line 608, and the valve 606. The valve 606 operates in response to control signals from the controller 50 (FIG. 1).

The pneumatic system of FIG. 13 may also feed (via the line 603) yet another four-way, three-position solenoid operated valve 630 coupled via ports 632, 634 to opposite sides of the pneumatic actuator 262 (FIG. 3) for shifting the cassette holders and stacks of cassettes supported thereby transversely between the wafer transfer zone and the cassette transfer zone. The valve 630 operates in the same manner as the valve 606 and for this reason will not be described in detail. The operation of valve 630 is controlled in response to signals from the controller 50.

With reference to FIG. 9, in operation, the cassette positioner 22 moves a cassette, such as cassette 16 on platform 120, in the Z direction to place the undersurface of a wafer 32 in a horizontal plane at an elevation 380 that is approximately level with, but preferably is slightly above, the wafer engaging surface 420 of the arm 400. The pneumatic system is then actuated to cause the platform 402 to shift in the X direction to place the arm beneath the wafer to be removed from the stack. Stop block 502 limits the motion of the arm toward the wafer cassette. Thus, the valve 606 (FIG. 13) is operated to deliver air to a pneumatic cylinder coupled to the platform 402 for purposes of moving the platform. The arm enters the cassette 16 and is located slightly below the wafer to be transferred. Thereafter, the cassette platform 402 is indexed in a downward direction so that the wafer surface contacts the arm 400 (FIG. 10). The pneumatic system is also operated so that the vacuum generator 602 (FIG. 13) causes a vacuum to be drawn at the port 577 (FIG. 12C) and thereby through the openings 576 located at the wafer engaging surface 420 at the distal end 566 of the arm. As a result, the wafer is detachably coupled to the arm by the force of the partial vacuum. The pneumatic system is then operated to control the platform 402 to move the platform in the opposite direction and to the location shown in solid lines in FIG. 9. The stop 500 limits the motion in this direction.

The motor 560 is again actuated, in response to the controller, to pivot the arm 400 about the axis 404 with the longitudinal axis of the arm traveling in the X-Z plane. In the illustrated embodiment, the arm pivots through approximately 180 degrees to thereby flip the wafer over the top of the platform 402 and orient what was once the upper side of the wafer in a downward facing orientation. This position is shown in dashed lines in FIG. 9.

The pneumatic system is then operated to relieve the vacuum from the arm and, in the illustrated embodiment, a pulse of air is delivered to the orifices 576 in the arm to prevent the wafer from sticking to the arm as a result of any incidental remaining vacuum. The wafer 32 is thus deposited at the destination location, such as onto the conveyor 30.

Thereafter, the motor 560 again pivots the arm 400 through the X-Z plane to the position shown in solid lines in FIG. 1. The wafer loader 24 is again ready for movement toward the cassette 16 to retrieve another wafer 32.

In an alternative construction, the wafer engaging surface may be located at the underside of arm 400 with the wafers being picked up from above for transfer.

The unloading station 14 (FIG. 1) includes an unloader 40 for unloading individual wafers from the conveyor 30, or from another area, and delivering the wafers to a waiting cassette. Any suitable unloader may be used in the system of the present invention. However, a specifically preferred form of water slide unloader 40 is shown in FIGS. 2 and 14–21.

With reference to FIGS. 2 and 14, a water slide unloader 40 in accordance with this embodiment is shown for conveying semiconductor wafers 32 between locations in a semiconductor manufacturing process line. In FIG. 14, the water slide unloader delivers wafers from a first location 714 in the process line to a second location 716. In the illustrated example, the wafer 32 is shown being transported by the wafer conveyor 30 which terminates at the first location 714. In addition, a wafer receiving cassette 16 is supported at the location 716.

Wafer cassette 16 is supported by the cassette holder 44, as previously described, which indexes the wafer cassette to position an empty wafer receiving slot at the wafer transfer location at the base of the water slide. The slot is positioned in alignment with the upper wafer guiding surface of the water slide to receive a wafer which travels down the water slide between the first and second locations 714, 716. The cassette holder 44 indexes the wafer cassette 16, and another similar cassette positioned below the first cassette, to repetitively position an empty slot at the base of the slide for receiving the next wafer. The wafer cassettes 16 are supported within a tank 750 filled with water to a level 754. An overflow spout 756 prevents the water from rising above a desired level in the tank.

Figure 16:
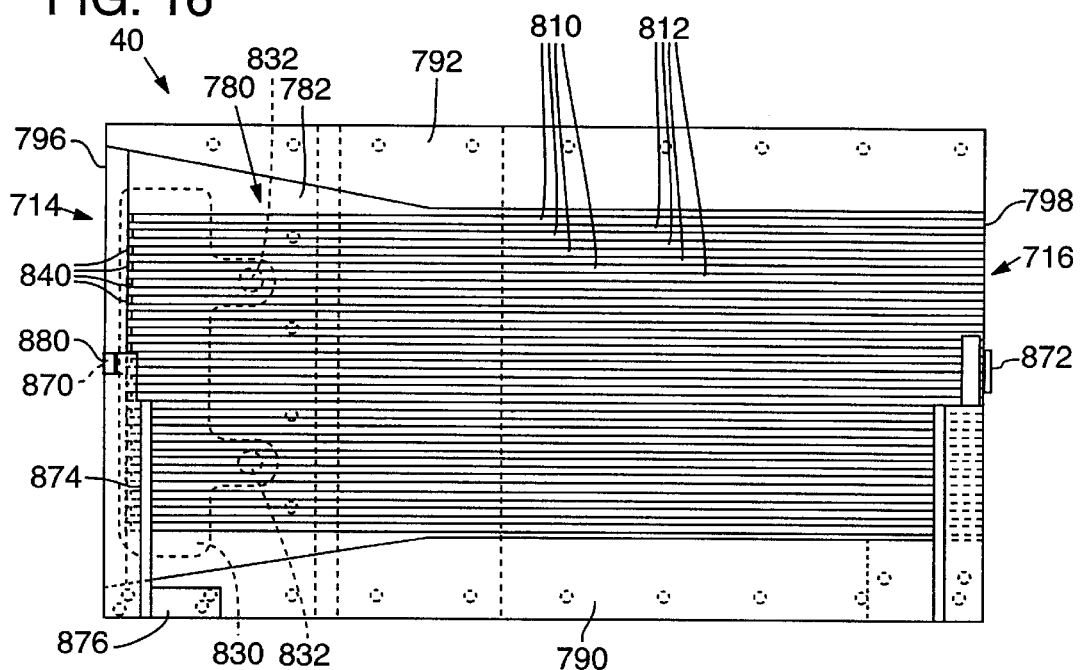
FIG. 16 is a top plan view of the water slide unloader of FIG. 14.
Figure 17:
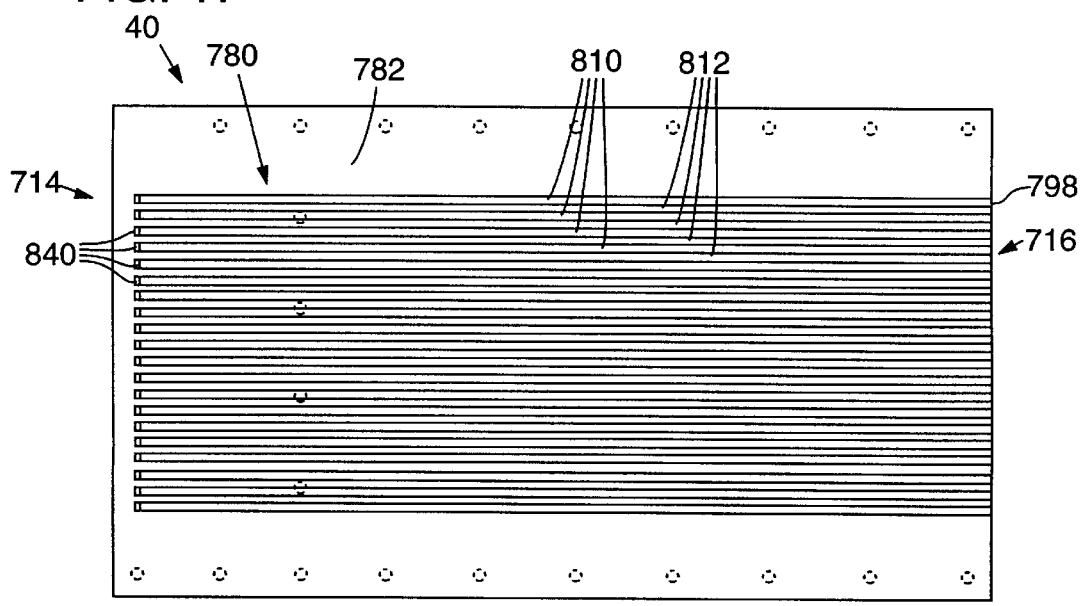
FIG. 17 is a top plan view of a water channel defining plate used in the water slide unloader of FIG. 14.

The illustrated water slide unloader 40 is supported by a frame 770 described in greater detail below. The water slide unloader 40, as shown in FIGS. 14–18, includes an elongated base 780 having an upper surface 782 and an undersurface or bottom surface 784. The base is preferably a monolithic plate-like structure with the upper surface 782 being smooth, flat and planar. First and second side rails 790, 792 (FIG. 16) are positioned to extend lengthwise along the base 780 from an upper end 796 of the base to a lower end 798 of the base. The side rails 790, 792, together with the upper surface 782 of base 780, define a wafer guide channel extending between the ends 796, 798 of the base. As can be seen in FIG. 16, the adjacent side edges of the rails 790, 792 diverge away from one another moving toward the upper end 796 of the base. In other words, rails 790, 792 are tapered in the direction moving toward end 796 to thereby define an entrance opening 800 at the upper end of the water slide which is wider than the distance between the rails 790, 792 at the bottom end of the water slide. Consequently, if any wafers are slightly off-center as they leave the conveyor, they will be guided by the rails toward the center of the slide.

A plurality of water carrying grooves 810 (FIG. 16) are provided in the upper surface 782 of the base 780. These grooves may be defined in any convenient manner, such as by mounting strips to the upper surface with the grooves being defined between these strips. However, in the preferred embodiment of the invention, the grooves 810 are recessed into the base surface 782 and are separated by lands 812 which, in the illustrated embodiment, are in the plane of the upper surface 782 of base 780.

As best seen in FIG. 16, the illustrated grooves 810 are preferably parallel and spaced-apart. These grooves extend in a direction which is also parallel to the longitudinal axis of the base 780. The grooves in the illustrated embodiment each start at a location spaced a short distance (e.g. about one-fourth to one-half inch) from the upper end of the water slide and extend continuously to the lower end of the slide. Although the illustrated pattern of grooves is advantageous, other arrangements of grooves which carry sufficient water to support wafers on water above the surface 782 of the water slide may be used.

The grooves 810 may be formed in any convenient manner. However, in the illustrated embodiment they are preferably formed by precision machining. To facilitate machining and to provide a surface which is wear-resistant and which minimizes the potential of contaminants wearing from the water slide, the water slide is preferably of a durable easily machined material such as acrylic plastic. As a specific example, black acrylic plastic, such as "Plexiglas" with carbon black therein, may be used. The invention, however, is not limited to a specific type of material.

Figure 21:
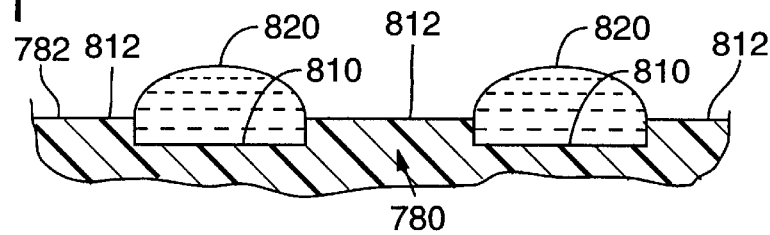
FIG. 21 is a schematic representation of the meniscus of water that forms above the grooves in the absence of a wafer.

This material is supplied with a surface which is smooth and polished in appearance. Consequently, water droplets which impinge on this surface bead up to form a meniscus. The grooves 810 which are machined into the surface have a rougher texture than the lands 812 or smooth unmachined surfaces. Consequently, the grooves are more hydrophilic than the land portions of the upper major surface adjacent to the grooves. As a result, water flowing down the water slide tends to be drawn into the grooves 810 and away from the land portions 812 of the surface 782. This is illustrated in FIG. 21, which schematically represents a meniscus of water 820 which projects above surface 782 in the region of each groove 810 as water flows down the groove. The water is drawn away from the lands 812 and collects in the grooves.

Thus, in accordance with the present invention, the grooves are more hydrophilic than the portions of the upper major surface adjacent to the grooves. Other ways may be utilized to make grooves which are more hydrophilic than the adjacent lands. For example, the lands could be polished to a higher degree than the grooves or different materials or coatings may be used for the lands and the grooves.

In the specifically illustrated embodiment, the grooves are machined with an average roughness in the range of from 63 to 125 microinches. The average roughness involves a determination of the measured surface from the nominal surface. Conversely, the lands have a roughness ranging from 4 to 16 microinches.

Figure 20:
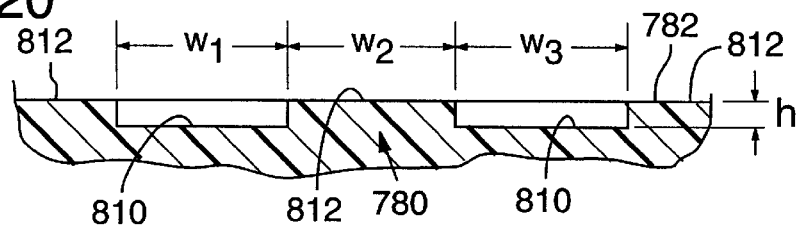
FIG. 20 is a vertical sectional view taken transversely across a portion of the base of the water slide unloader of FIG. 14 to illustrate several of the grooves included in the water slide.

Although this may be varied, with reference to FIG. 20, the grooves 810 in the illustrated embodiment are rectangular in cross-section. The grooves 110 are most preferably uniform and uniformly spaced apart. The illustrated grooves have a width $W_1$ or $W_3$ of from one-eighth inch to three-eighth inch, a depth of from 0.01 inch to 0.025 inch, and are spaced apart from edge to edge, a distance $W_2$, from one-fourth inch to three-eighth inch. As a specific preferred embodiment, the grooves have a width of about 0.2 inches, are spaced apart about 0.2 inches, and have a depth of about 0.02 inches. In a specifically constructed embodiment of the water slide, the grooves were 0.195 inch wide, spaced apart 0.195 inch, and had a depth of 0.016 inch.

Referring again to FIG. 14, the water slide is tilted downwardly at an angle θ relative to horizontal. Although variable, the angle θ is preferably from about eight degrees to about twenty-five degrees from horizontal, with fifteen degrees from horizontal being a specifically preferred example.

Figure 18:
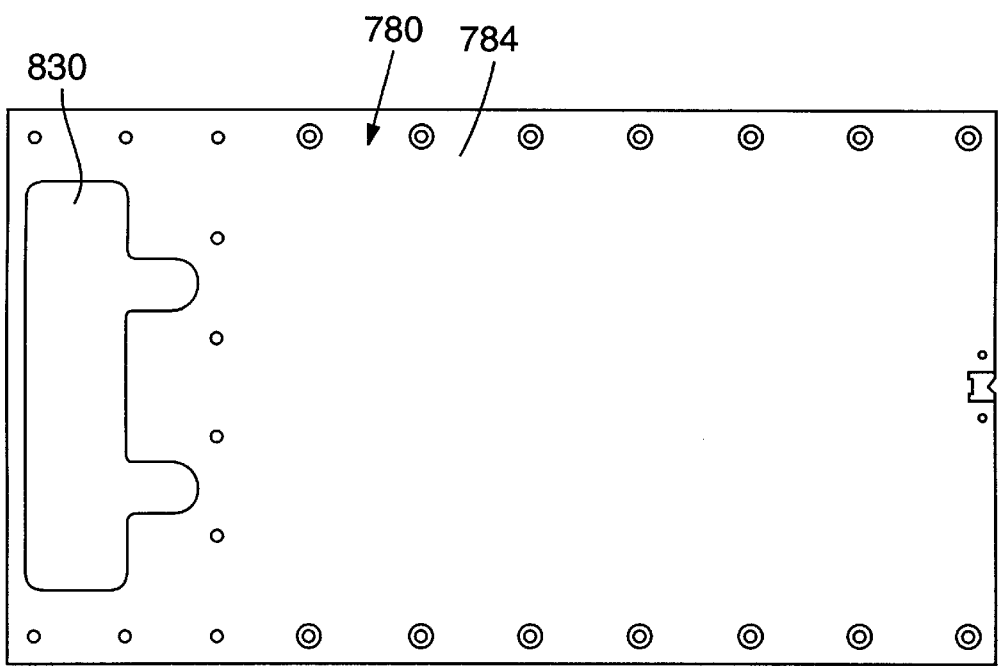
FIG. 18 is a bottom view of the plate of FIG. 17.

With reference to FIGS. 14, 15, 16 and 18, the base 780 is provided with a water supply manifold 830 which is preferably recessed into the underside of the base (see FIG. 18). As best seen in FIG. 14, a cover plate 831 is mounted to the undersurface 784 of the base to close the water supply manifold from below. A pair of spaced-apart water supply inlets 832 communicate with the manifold 830 for delivery of water to the manifold. A water supply port communicates respectively between each of the grooves 810 and the water supply manifold 830. Some of the water supply ports are numbered as 840 in FIG. 16. Consequently, water delivered to the manifold goes through the respective water supply ports 840 and into the grooves of the water slide. The water supply ports 840 are also visible in the plate 780 shown in FIG. 17.

Figure 19:
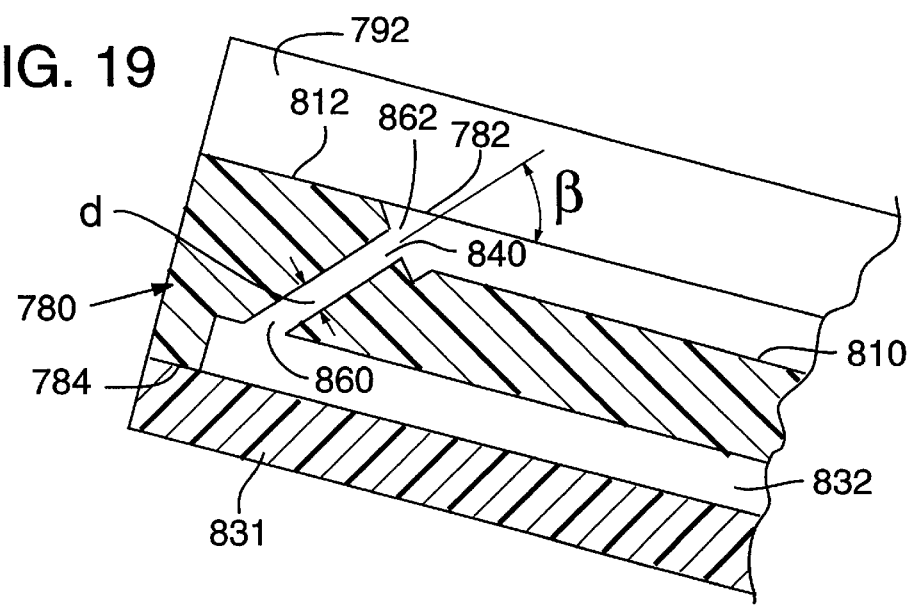
FIG. 19 is a partially broken-away vertical sectional view, taken along line 19—19 of FIG. 15, which illustrates a water supply port for delivering water to one of the water carrying grooves.

With reference to FIG. 19, the water supply ports each have an inlet 860 communicating with the manifold 832 and an outlet 862 communicating with the upper end portion of an associated groove 810. Most preferably, the longitudinal axis of the water supply port 840 is angled relative to the plane of the upper surface 782 of the body 780, with the angle being indicated as β in FIG. 19. Consequently, water entering the grooves has a significant component of flow velocity directed along the length of the grooves. Most preferably, β is an acute angle from about thirty degrees to about sixty degrees, and most preferably in a specific embodiment is forty-five degrees.

Sensors may be utilized to detect the delivery of a wafer to the water slide and to detect the exiting of the wafer from the slide. As a specific example, optical sensors may be used for this purpose. In a specific form, a light transmitter 870 (FIG. 15) may be positioned along the longitudinal centerline of the water slide at the upper end 796 of the body 780. In addition, a light emitting transmitter 872 may be positioned at the bottom end 798 of the water slide and centered in the middle of the water slide.

As shown in FIG. 15, a sensor supporting arm 874 is positioned above the sensor 870. A spacer 876 is positioned between the undersurface of arm 874 and the upper surface of side rail 790 to provide added clearance between the arm and the upper surface 782 of the body 780. A light detector 880 is mounted to the arm 874 in a position above the light emitter 870. Whenever the beam between emitter 870 and detector 880 is broken, the detector 880 transmits a signal to the controller 50 and thereby senses and indicates that a wafer has entered the water slide. A similar arm 882 is positioned at the bottom end 798 of the water slide and overhangs the light emitter 872. The arm 882 supports a light detector operable in the same manner as the sensor 880 to transmit a signal to the controller whenever the beam between the emitter 872 and detector is broken. By detecting the entry and exit of wafers from the water slide, one can determine, for example, whether a wafer is present on the water slide and the unlikely event that wafers have jammed on the water slide (for example, if multiple wafers are detected as entering the water slide and fewer wafers are detected as exiting the water slide over a given time period).

A spacer, such as spacer 876, is typically not required at the lower end of the water slide, as wafers at the lower location are traveling in a direction generally parallel to the surface 782. In contrast, as wafers leave the conveyor 30 and enter the upper end of the slide, the wafers change orientation relative to horizontal. The spacer 876 provides greater clearance to allow the wafers to change orientation as they commence traveling down the water slide.

A mounting plate 892 (FIG. 14) is secured to the undersurface 784 of the body 780. A mounting bracket 894 is coupled to a flange 896, with the flange 896 being supported by a post section 898 of the frame 770. The bracket 894 is fastened to the mounting plate 892 to support the water slide at the desired elevation and in the desired position. Elongated slots 900 are provided in flange 896 at the location where the flange is coupled to the post 898 to provide free play for vertical adjustment of the elevation of the water slide. Similarly, elongated slots 902 couple the bracket 894 to the flange 896 to provide free play for horizontal adjustment of the water slide. Each side of the water slide is typically mounted to the frame of the unloading station in the same manner.

Although the illustrated water slide may be assembled in any convenient manner, most preferably threaded fasteners are utilized for this purpose. Alternatively, adhesive or some combination of adhesive and mechanical fasteners may be used.

The illustrated water slide unloader 40 advantageously minimizes the amount of water required to carry semiconductor wafers from one end of the slide to the other. For example, although more water may be used, in one water slide constructed in this manner, this specific water slide having a length of 540 mm, a water guide channel width of 210 mm, and 20 grooves, only fifteen to eighteen gallons of water per hour was required to successfully operate the water slide. Preferably, less than thirty gallons of water per hour is required, and most preferably no more than about fifteen to eighteen gallons per hour is required. In this specific example, the water ports were circular in cross section with a diameter d (FIG. 19) of the water supply port 140 being 0.0625 inch. This compares with water usage of one hundred gallons or more per hour for conventional water slides in which a sheet of water is continuously maintained across the entire surface of the water slide.

Figure 22:
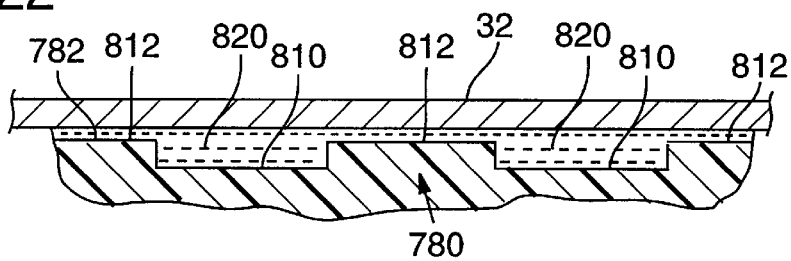
FIG. 22 is a schematic representation of the flattening of the meniscus of water and spreading of the water across the surface of the water slide unloader and beneath a wafer when a wafer is present.
Figure 23:
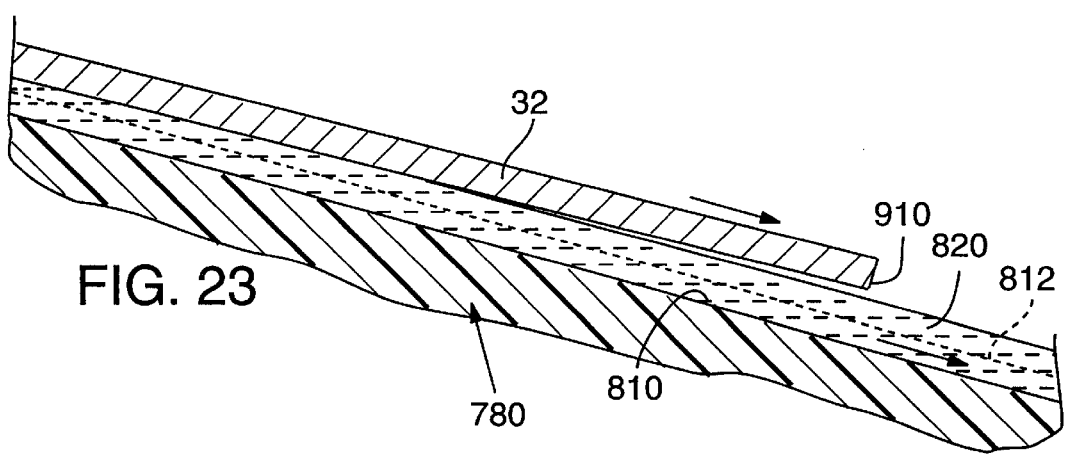
FIG. 23 illustrates schematically the raising of the lower or downwardmost edge of a wafer as it travels down the water slide unloader of FIG. 14.

With reference to FIGS. 21–23, in operation and in the absence of a wafer on the water slide, water flowing down the slide is drawn into the respective grooves 810 and away from the lands 812. A traveling meniscus of water 820 is formed above each of the grooves. As a wafer passes down the water slide, as represented in FIG. 22, the meniscus 820 above each groove is flattened and spreads so that the lands 812 between the grooves 810 are covered with a layer of water. Most preferably, the entire undersurface of the wafer 32 is wetted by water and thus supported away from the upper surface 782 of the body 780 of the water slide. As represented in FIG. 23, the wafer 32, in effect, surfs down the water slide. The downwardmost edge of the wafer rides on the crest of water formed as the downwardmost edge 810 of the wafer encounters the meniscus 820 above each of the grooves. Following the passage of the wafer, due to the hydrophilic nature of the grooves 810, water flows off the lands and collects in the grooves. It should be noted, however, that the water slide is not limited to any specific theory of operation.

With this construction, one need not continuously maintain a sheet of water across the entire surface of the water slide. Consequently, water usage is substantially reduced.

Having illustrated and described the principles of the invention with reference to preferred embodiments, it should be apparent to those of ordinary skill in the art that the invention may be modified in arrangement and detail without departing from such principles. We claim as our invention all such modifications as fall within the scope of the following claims.

We claim:

1. In a wafer handling system, a wafer cassette positioner for supporting and shifting wafer cassettes having a plurality of wafer holding slots to successively position the wafer holding slots at a wafer transfer location in a wafer transfer zone, the wafer cassette positioner comprising:
   a positioner support;
   first and second spaced apart cassette holders, the first and second cassette holders each being configured to hold at least one wafer cassette with the wafer holding slots of the wafer cassettes being oriented in a first direction;
   a first elevator supporting the first cassette holder and operable to incrementally index the at least one wafer cassette supported by the first cassette holder in an upright direction to position individual wafer holding slots of the supported cassette at the wafer transfer location when the first cassette holder is in the wafer transfer zone;
   a second elevator supporting the second cassette holder and operable to incrementally index the at least one wafer cassette supported by the second cassette holder in an upright direction so as to position wafer slots of such wafer cassette supported by the second cassette holder at the wafer transfer location when the second cassette holder is positioned in the wafer transfer zone;
   at least one elevator mover coupled to the positioner support and operable to shift the first elevator and the first cassette holder from a first position in which the at least one wafer cassette supported by the first cassette holder is in the wafer transfer zone to a second position in which the at least one wafer cassette supported by the first cassette holder is at a second position spaced from the wafer transfer zone, the elevator mover also being operable to shift the second elevator and the second cassette holder from a third position in which the at least one wafer cassette supported by the second cassette holder is spaced from the wafer transfer zone to a fourth position in which the at least one wafer cassette supported by the second cassette holder is in the wafer transfer zone, and wherein the first and fourth positions are at the same location.

2. A wafer handling system according to claim 1 in which each of the first and second spaced apart cassette holders include a stack of at least two wafer cassettes, one wafer cassette in each stack being positioned generally above the other wafer cassette of each stack.

3. In a wafer handling system, a wafer cassette positioner for supporting and shifting wafer cassettes having a plurality of wafer holding slots to successively position the wafer holding slots at a wafer transfer location in a wafer transfer zone, the wafer cassette positioner comprising:
   a positioner support having a cassette elevator support portion;
   first and second spaced apart cassette holders, the first and second cassette holders each being configured to hold at least one wafer cassette with the wafer holding slots of the wafer cassette oriented to receive wafers when the slots are positioned at a wafer transfer location;
   a first elevator carried by the cassette elevator support portion and supporting the first cassette holder and operable to index the wafer cassette supported by the first cassette holder in an upright direction to position individual wafer holding slots of the supported wafer cassette at the wafer transfer location when the first cassette holder is in the wafer transfer zone, wherein the first elevator couples the first cassette holder to the cassette elevator support portion and thereby to the positioner support;
   a second elevator carried by the cassette elevator support portion and supporting the second cassette holder and operable to index the at least one wafer cassette supported by the second cassette holder in an upright direction so as to position wafer slots of such wafer cassette supported by the second cassette holder at the wafer transfer location when the second cassette holder is positioned in the wafer transfer zone, wherein the second elevator couples the second cassette holder to the cassette elevator support portion and positioner support;
   the cassette elevator support portion being slidably coupled to the positioner support such that the first elevator and first cassette holder are slidable with the cassette elevator support portion from a first position in which the at least one wafer cassette supported by the first cassette holder is in the wafer transfer zone to a second position in which the at least one wafer cassette supported by the first cassette holder is at a second position spaced from the wafer transfer zone, and such that the second elevator and second cassette holder are slidable with the cassette elevator support portion from a third position in which the at least one wafer cassette supported by the second cassette holder is spaced from the wafer transfer zone to a fourth position in which the at least one wafer cassette supported by the second cassette holder is in the wafer transfer zone; and
   wherein the cassette elevator support portion comprises a sliding support mounted to the positioner support for shifting relative to the positioner support and a sliding actuator coupled to the positioner support and sliding support and operable to shift the sliding support; the first and second spaced apart cassette holders and first and second elevators being carried by the sliding support for movement with the sliding support, the sliding support being shiftable by the sliding actuator in a first direction to shift the first cassette holder from the first position to the second position and to shift the second cassette holder from the third position to the fourth position with the movement of the sliding support.

4. A wafer handling system according to claim 3 wherein the first wafer cassette elevator is coupled to the sliding support and to the first cassette holder and operable to index the first cassette holder relative to the sliding support in an upright direction, and wherein the second wafer cassette elevator is coupled to the sliding support and to the second cassette holder and operable to index the second cassette holder relative to the sliding support in an upright direction, whereby with the first cassette holder in the first position the first cassette holder may be indexed by the first elevator to position individual wafer slots of the wafer cassette supported by the first cassette holder at the wafer transfer location, and whereby when the second cassette holder is in the fourth position, the second cassette holder may be indexed by the second elevator to position individual wafer slots of the wafer cassette supported by the second cassette holder at the wafer transfer location.

5. A wafer handling system according to claim 4 wherein each elevator includes a guide and a wafer cassette supporting platform projecting outwardly away from the guide and indexable along the guide in the upright direction, the wafer cassette being movable with the indexing of the platform to shift the wafer cassettes in the upright direction, the platform projecting outwardly and away from the rod such that a wafer cassette may be positioned on the platform or removed from the platform from the rear of the frame without interference by the rod.

6. In a wafer handling system, at least two wafer cassette positioners for supporting and shifting wafer cassettes having a plurality of wafer holding slots to successively position the wafer holding slots at a wafer transfer location in a wafer transfer zone, the wafer cassette positioners each comprising:

a positioner support having a cassette elevator support portion;

first and second spaced apart cassette holders, the first and second cassette holders each being configured to hold at least one wafer cassette with the wafer holding slots of the wafer cassette oriented to receive wafers when the slots are positioned at a wafer transfer location;

a first elevator carried by the cassette elevator support portion and supporting the first cassette holder and operable to index the wafer cassette supported by the first cassette holder in an upright direction to position individual wafer holding slots of the supported wafer cassette at the wafer transfer location when the first cassette holder is in the wafer transfer zone, wherein the first elevator couples the first cassette holder to the cassette elevator support portion and thereby to the positioner support;

a second elevator carried by the cassette elevator support portion and supporting the second cassette holder and operable to index the at least one wafer cassette supported by the second cassette holder in an upright direction so as to position wafer slots of such wafer cassette supported by the second cassette holder at the wafer transfer location when the second cassette holder is positioned in the wafer transfer zone, wherein the second elevator couples the second cassette holder to the cassette elevator support portion and thereby to the positioner support;

at least one sliding actuator coupled to the cassette elevator support portion and operable to slide the first and second elevators and thereby to slide the first and second cassette holders; and the cassette elevator support portion being slidably coupled to the positioner support such that the first elevator and first cassette holder are slidable with the cassette elevator support portion from a first position in which the at least one wafer cassette supported by the first cassette holder is in the wafer transfer zone to a second position in which the at least one wafer cassette supported by the first cassette holder is at a second position spaced from the wafer transfer zone, and such that the second elevator and second cassette holder are slidable with the cassette elevator support portion from a third position in which the at least one wafer cassette supported by the second cassette holder is spaced from the wafer transfer zone to a fourth position in which the at least one wafer cassette supported by the second cassette holder is in the wafer transfer zone; and the apparatus comprising a loading station with one such wafer cassette positioner and an unloading station with another such wafer cassette positioner;

a loader at the loading station operable to remove a wafer from a slot of the cassette when the slot is positioned at the wafer transfer location and to shift the wafer from the slot to a second position spaced from the slot;

a conveyor having an end portion at the second position such that the loader deposits the loaded wafer onto the conveyor; and an unloading station having an unloader coupled to the conveyor for receiving wafers from the conveyor and transporting such wafers to a slot of a wafer cassette postioned at the wafer transfer zone of the unloading station.

7. A wafer handling system according to claim 6 including a wafer processing stage intermediate the loader and unloader through which wafers pass during processing.

8. A wafer handling system according to claim 6 in which each cassette holder is configured to hold at least two stacked wafer cassette holders, each for receiving a respective wafer cassette.

9. A wafer handling system according to claim 8 in which the first and second wafer cassette holders are exposed for receiving wafer cassettes from the rear at least when the first and second cassette holders are in the respective first and third positions.

10. A wafer handling system according to claim 6 in which the loader comprises an elongated wafer transfer arm having a proximate end and a distal end with a wafer coupling surface, a frame, a sliding platform slidably coupled to the frame, the arm being pivotally mounted to the platform for pivoting about an axis which is transverse to the longitudinal axis of the arm, and wherein the platform is slidable in a first direction to position the arm in position to engage a wafer in a slot of the cassette and in a second direction opposite to the first direction to remove the arm and engaged wafer from the cassette, and wherein the arm is pivotal through a major axis to invert the engaged wafer as the arm is pivoted.

11. A wafer handling system according to claim 6 in which the unloader comprises a water slide with a plurality of water carrying grooves.

12. In a wafer handling system, a wafer cassette positioner for supporting and shifting wafer cassettes having a plurality of spaced wafer holding slots to successively position the wafer holding slots at a wafer transfer location in a wafer transfer zone, the wafer cassette positioner comprising:

a positioner support having a base and an upright portion;

a sliding support coupled to at least one of the base and the upright portion of the positioner support and being operable for movement in opposed first and second directions;

a sliding support actuator operable to shift the sliding support in the respective first and second directions;

first and second spaced apart elevators carried by and slidable with the sliding support;

first and second spaced apart cassette holders configured to hold at least one wafer cassette, the first cassette holder being supported by the first elevator, the first elevator and first cassette holder being shiftable relative to the positioner support upon sliding of the sliding support so as to be shiftable by the sliding actuator from a first position in which the at least one wafer cassette supported by the first cassette holder is in the wafer transfer zone to a second position in which the at least one wafer cassette supported by the first cassette holder is at a second position spaced from the wafer transfer zone, the second cassette holder being supported by the second elevator, the second elevator and second cassette holder being shiftable relative to the positioner support upon sliding of the sliding support so as to be shiftable by the sliding actuator from a third position in which the at least one wafer cassette supported by the second cassette holder is spaced from the wafer transfer zone to a fourth position in which the at least one wafer cassette supported by the second cassette holder is in the wafer transfer zone;

the first elevator supporting the first cassette holder and being operable to position the at least one wafer cassette supported by the first cassette holder in an upright direction with at least one wafer holding slot of the at least one wafer cassette supported by the first cassette holder at the wafer transfer location when the at least one wafer cassette supported by the first cassette holder is in the wafer transfer zone; and the second elevator supporting the second cassette holder and being operable to position the at least one wafer cassette supported by the second cassette holder in an upright direction with at least one wafer holding slot of the at least one wafer cassette supported by the second cassette holder at the wafer transfer location when the at least one wafer cassette supported by the second cassette holder is positioned in the wafer transfer zone.

13. A wafer handling system according to claim 12 wherein there is only one sliding support actuator operable to shift the sliding support and thereby both the first elevator between the first and second positions and the second elevator between the third and fourth positions and wherein the sliding support comprises a common slide element carrying both of the first and second elevators such that the first and second elevators slide together.

14. A wafer handling system according to claim 12 in which the first and second wafer cassette holders are exposed for receiving wafer cassettes from the rear at least when the first and second cassette holders are in their respective first and third positions.

* * * * *